United States Patent [19]
Tsuchitani et al.

[11] Patent Number: 5,367,429
[45] Date of Patent: Nov. 22, 1994

[54] ELECTROSTATIC TYPE MICRO TRANSDUCER AND CONTROL SYSTEM USING THE SAME

[75] Inventors: Shigeki Tsuchitani, Mito; Seiko Suzuki, Hitachioota; Satoshi Shimada, Hitachi; Masayuki Miki, Katsuta; Masahiro Matsumoto, Hitachi; Susumu Murakami, Katsuta; Akira Koide, Chiyoda; Masahiro Kurita, Katsuta; Hiromichi Ebine, Oomiya, all of Japan

[73] Assignees: Hitachi, Ltd, Tokyo; Hitachi Automotive Engineering Co., Ltd., Ibaraki, both of Japan

[21] Appl. No.: 962,508

[22] Filed: Oct. 16, 1992

[30] Foreign Application Priority Data

Oct. 18, 1991 [JP] Japan ................................. 3-270716
Mar. 19, 1992 [JP] Japan ..................................... 4-63154

[51] Int. Cl.⁵ ..................... H01G 7/00; H01G 13/00; G01P 15/08
[52] U.S. Cl. .................. 361/280; 361/283.1; 361/283.3
[58] Field of Search ................ 361/280, 283.1, 283.3; 73/517 R, 517 A, 517 AV

[56] References Cited

U.S. PATENT DOCUMENTS

| | | | |
|---|---|---|---|
| 3,772,567 | 11/1973 | Leiber et al. | 361/283 X |
| 4,574,327 | 3/1986 | Wilner | 361/283 |
| 4,609,968 | 9/1986 | Wilner | 361/320 |
| 4,882,933 | 11/1989 | Petersen et al. | 73/517 R |
| 4,930,042 | 5/1990 | Wiegand et al. | 361/280 |
| 4,999,735 | 3/1991 | Wilner | 361/283.1 |
| 5,095,752 | 3/1992 | Suzuki et al. | 73/517 R |
| 5,243,861 | 9/1993 | Kloeck et al. | 73/517 R |

FOREIGN PATENT DOCUMENTS

| | | |
|---|---|---|
| 4032828 | 4/1991 | Germany. |
| 4100451 | 7/1991 | Germany. |
| 60-244864 | 12/1985 | Japan. |

OTHER PUBLICATIONS

*Sensor Review* entitled "Sensor technology: Japan update", Oct. 1988, pp. 207–209.
*Electronic Design* 45 entitled "Airbags Boom When IC Accelerometer Sees 50 G", Aug. 8, 1991.
Noritake Ura and Masayoshi Esashi, "Differential Capacitance Silicon Accelerometer" (Technical Digest of the 10th Sensor Symposium May 30–31, 1991, pp. 41–44).

*Primary Examiner*—Marvin M. Lateef
*Attorney, Agent, or Firm*—Evenson, McKeown, Edwards & Lenahan

[57] ABSTRACT

An electrostatic type micro accelerometer comprising means for preventing permanent sticking between a movable electrode and a stationary electrode due to residual dielectric polarization, resisual electric charges and water adsorption and condensation around possible contacting portions therebetween when the movable electrode excessively displaces. The sticking preventing means is realized by disposing one of electric field reducing means, water adsorption and condensation reducing means and contacting area limiting means around the possible contacting portions.

38 Claims, 19 Drawing Sheets (VALVE OPENED)

(VALVE CLOSED)

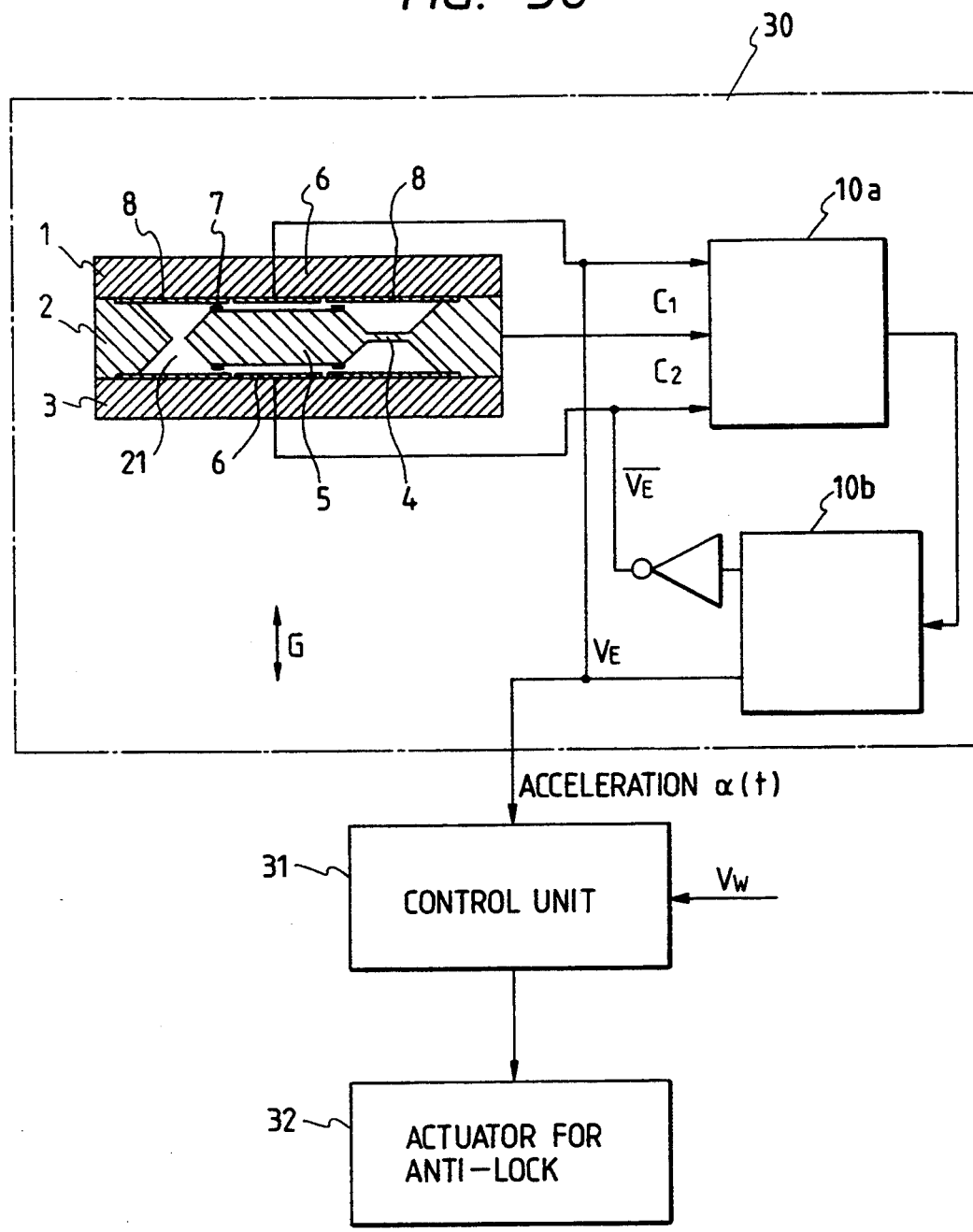

ELECTROSTATIC TYPE MICRO TRANSDUCER AND CONTROL SYSTEM USING THE SAME

BACKGROUND OF THE INVENTION

1. Field of the Invention

The present invention relates to an electrostatic type micro transducer such as a micro sensor and a micro actuator, and a control system using the same, and in particular relates to an electrostatic type micro transducer having an improved yield during the production thereof and an excellent reliability during the use thereof, and a control system using the same.

2. Description of Related Art

In general, a plurality of physical forces due to several kinds of mechanisms act between surfaces of solid bodies, in particular in a micro sensor which is constituted by micro structural bodies the ratio of their surface area with respect to their masses becomes large so that the mutual action between the surfaces plays an important role. For example, a plurality of attractive forces due to several kinds of mechanisms are induced between movable parts or between a movable part and a stationary part which are facing each other with or without a microscopic gap therebetween so that it sometimes happens that both parts stick to each other to render the micro sensor inoperative.

An example of conventional micro sensors serving as an accelerometer is disclosed in JP-A-60-244864 (1985), which corresponds to U.S. Pat. Nos. 4,574,327 and 4,609,968, wherein a plurality of dielectric stops are provided on a movable capacitor plate to prevent a short circuiting current flowing between the movable capacitor plate and an opposing fixed capacitor plate when both are contacted.

In the above conventional micro sensor, the technical problem with regard to prevention of short circuiting current between the movable and fixed capacitor plates has been resolved by means of the dielectric stops, however no consideration is given with regard to prevention of sticking by physical forces between the movable electrode plate and the stationary electrode plate in a micro sensor because of the very existence of the dielectric stops. Namely, in the micro sensor such as an electrostatic type micro sensor and an electrostatic servo type micro sensor, the movable electrode may be attracted toward the stationary electrode due to an electrostatic attraction force during the production thereof or during the handling thereof before or after mounting thereof, when a high voltage is applied for some causes between the movable electrode and the stationary electrode or when a charged external body touches the micro sensor and a static electricity is charged between the both electrodes, such is caused, for example, when clothes, charged by static electricity, of a worker touches to an electrode terminal of the micro sensor during the handling thereof. At this moment, a high electric field is applied to an electric insulator film such as the dielectric stop provided on the electrodes, thus a dielectric polarization thereof, a movement of movable electric charges such as ions contained within the insulator film, an injection of electric charges from the outside into the insulator film and an accumulation of electric charges in the interfaces between the insulator film and electrodes are caused thereby a spacial distribution of electric charges is generated inside the insulator film or at the vicinity of the interfaces between the insulator film and the electrodes, and such spacial electric charge distribution may remain even after the electric field caused from the outside is removed.

Because of these residual dielectric polarization and residual electric charges, an attractive force due to the electrostatic force is caused between the facing electrodes spaced apart with the electric insulator film and a microscopic gap. As a result, there arises an undesirable phenomenon of continuous sticking of the movable electrode and the stationary electrode via the insulator film, herein the term "sticking" is used to indicate a phenomenon wherein facing contacting surfaces connect each other by microscopic physical forces other than chemical bonding forces acting on the respective facing surfaces.

SUMMARY OF THE INVENTION

An object of the present invention is to provide an electrostatic type micro transducer such as a micro sensor and micro actuator having a measure which prevents sticking between the movable electrode and the stationary electrode therefor which may render the electrostatic type micro transducer inoperable.

Another object of the present invention is to provide a control system which uses such reliable electrostatic type micro sensor.

The former object according to the present invention is achieved by an electrostatic type micro transducer which comprises a movable electrode member, a stationary electrode member disposed facing the movable electrode member and a sticking force reducing means between the movable electrode member and the stationary electrode member.

According to one aspect of the present invention, the sticking force reducing means is achieved by providing means for preventing or reducing residual dielectric polarization and residual electric charges between the movable electrode member and the stationary electrode member.

According to another aspect of the present invention, the sticking force reducing means is achieved by providing means for preventing contacting or for limiting contact area between the movable electrode member and the stationary electrode member when the movable electrode member excessively displaces.

According to a further aspect of the present invention, the sticking force reducing means is achieved by filling the space between the movable electrode and stationary electrode with a dry gas or by evacuating the same.

The latter object according to the present invention is achieved by a motor vehicle control system in which an electrostatic capacitive type or an electrostatic servo type accelerometer is mounted on a motor vehicle to be controlled. The accelerometer includes a movable electrode member suspended by an elastic member and a stationary electrode member disposed facing the movable electrode member spaced apart with a predetermined gap and further includes a sticking force reducing means between the movable electrode member and the stationary electrode member. Data necessary for at least one of anti-lock brake control, active suspension control, total spin control, traction control and air bag control for the motor vehicle is obtained from the output of the accelerometer and at least one of the motor vehicle controls is performed based upon the data obtained.

With the provision of the sticking force reducing means between the movable electrode member and the stationary electrode member in the electrostatic type micro transducer, when the movable electrode member excessively displaces during the use of the micro transducer and contacts to the stationary electrode member, the sticking between the movable electrode member and the stationary electrode member is prevented thereby the operation of the micro transducer is maintained.

Further, with the provision of means for preventing or reducing residual dielectric polarization and residual electric charges in the electrostatic type micro transducer, electric charges spacially distributed within the electrical insulator film formed on the electrode surfaces and at the vicinity of interfaces between the insulator film and the electrodes are removed or sufficiently reduced, thereby an attractive force between the electrical insulator film and the opposing electrode due to electrostatic force is eliminated or is rendered smaller than the restoring force of the elastic member suspending the movable electrode member. Thus, the sticking of the both electrode members is prevented.

Still further, with the provision of means for preventing contacting or limiting contact area between the movable electrode member and the stationary electrode member when the movable electrode member excessively displaces in the electrostatic type micro transducer, a substantial contacting area between the movable electrode member and the stationary electrode member is reduced and the sticking force between movable electrode member and the stationary electrode member is also reduced as a whole. Thus, the sticking of both electrode members is prevented.

Still further, with the provision of means for reducing water deposition on possible contacting surfaces of the movable electrode member and the stationary electrode member such as by sealing a dry gas into the space between the movable electrode member and the stationary electrode member or by evacuating the space in the electrostatic type micro transducer, the humidity at the space is reduced and the amount of water adsorption and condensation on the possible contacting surfaces of the movable electrode member and the stationary electrode member is also reduced, thereby the sticking forces via water such as liquid bridging force and hydrogen atom coupling force between water molecules physically adsorbed on the possible contacting surfaces is reduced. Accordingly, the sticking between both electrodes because of water is prevented.

Further, with the motor vehicle control system using the electrostatic capacitive type or electrostatic servo type accelerometer with the sticking force reducing means between the movable electrode member and the stationary electrode member, malfunctioning of the accelerometer because of the sticking of the both electrodes is eliminated. Accordingly, reliability of the motor vehicle control system is improved.

BRIEF DESCRIPTION OF THE DRAWINGS

FIGS. 35(a) and 35(b) are schematic cross sectional views of one embodiment of micro actuators in a form of an electrostatically operable valve wherein FIG. 35(a) shows the open state thereof and FIG. 35(b) shows the closed state thereof;

FIG. 36 is a block diagram of one embodiment of vehicle control systems according to the present invention incorporating the micro accelerometer shown in FIG. 1.

DESCRIPTION OF THE PREFERRED EMBODIMENTS

Hereinbelow, the present invention is explained with reference to the embodiments, in particular mostly with reference to embodiments in forms of electrostatic capacitive type or electrostatic servo type accelerometers. Further, hereinbelow the same numerals and symbols designate the same or equivalent element.

Figure 1:
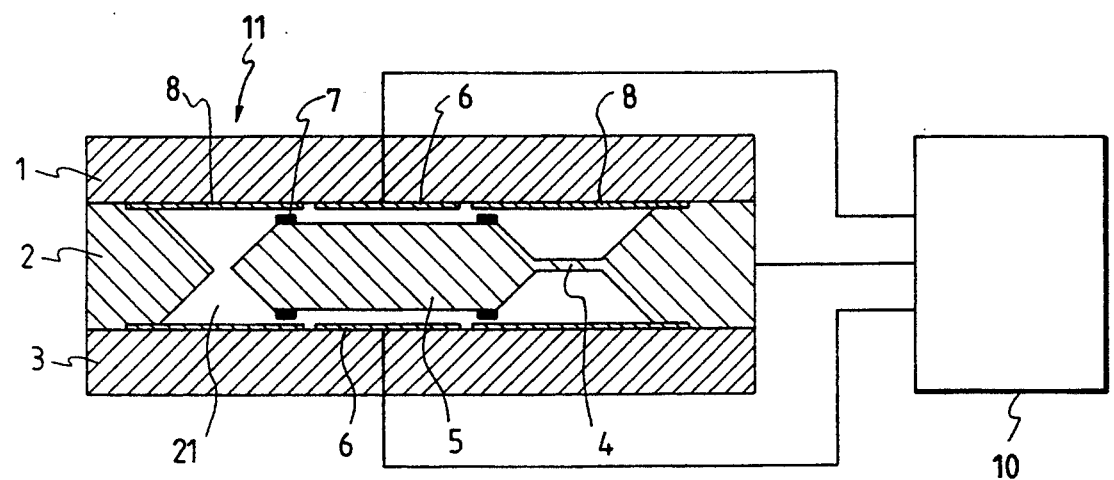
FIG. 1 is a cross sectional view of the first embodiment of micro accelerometers according to the present invention taken along the line I—I in FIG. 2.
Figure 2:
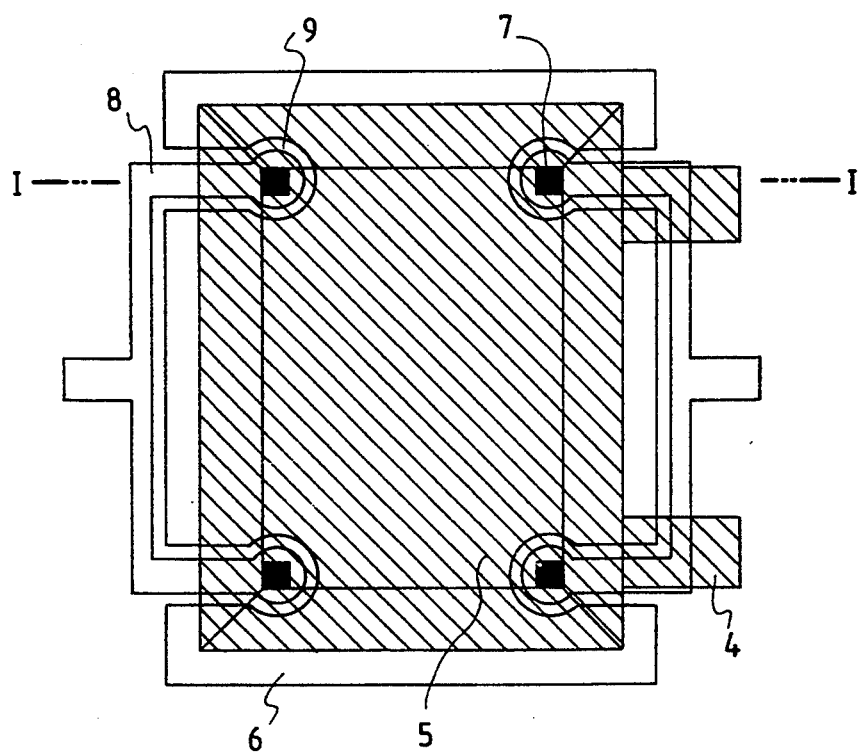
FIG. 2 is a plan view of the electrode portion of the first embodiment shown in FIG. 1.

FIG. 1 is a vertial cross sectional view taken along the line I—I in FIG. 2 of the first embodiment of accelerometers using a silicon semiconductor body according to the present invention which is applicable both for an electrostatic type and electrostatic servo type. FIG. 2 is a plan view of the first embodiment drawn by viewing from the movable electrode side toward one of the opposing stationary electrodes and the equipotential electrodes side.

In FIG. 1, reference numeral 2 is a silicon substrate, and through etching process thereof a movable electrode 5 serving as a seismic mass and a cantilever 4 are formed integrally. Substrates 1 and 3 are arranged in opposing relation while sandwiching the silicon substrate 2 therebetween. The entire parts of the substrates 1 and 3 or at least the surface portions facing the silicon substrate 2 thereof are made of an insulating material and in the present embodiment made by Pyrex glass. A pair of stationary electrodes 6 are formed on the respective substrates 1 and 3 so as to face the respective major surfaces of the movable electrode 5 with a microscopic gap of about 1~10 μm respectively.

On a part of the major surfaces of the movable electrode 5, electrical insulator films 7 are disposed and in the present embodiment four insulator films 7 are disposed at the four corners on each of the respective major surfaces of the movable electrode 5. Equipotential electrodes 8 with the movable electrode 5 are formed on the insulator substrates 1 and 3 at the position facing the insulator films 7 on the movable electrode 5. Accordingly, when the movable electrode 5 excessively displaces the insulator films 7 on the movable electrode 5 they initially contact the equipotential electrodes 8 to thereby eliminate direct contacting of the insulator films 7 to one of the stationary electrodes 6.

As illustrated FIG. 2, the equipotential electrodes 8 formed on the respective substrates 1 and 3 are designed to extend into stationary electrode removing portions or notching portions 9 so as to face the respective insulator films 7 on the movable electrode 5 in order to allow contact thereto when the movable electrode 5 excessively displaces.

When the accelerometer of the present embodiment is used as an electrostatic capacitive type accelerometer, the movable electrode 5 and the stationary electrodes 6 constitute capacitors and when the movable electrode 5 displaces the capacitances thereof vary. Namely, when there appears a certain acceleration in the direction perpendicular to the major faces of the substrates 1, 2 and 3, an inertial force acts on the movable electrode 5 and the movable electrode 5 displaces upward or downward in the drawing against the restoring force of the cantilever 4. The displacement thereof is detected by the change of electrostatic capacitance between the movable electrode 5 and the stationary electrodes 6 and an acceleration measurement circuit 10 calculates the acceleration via conversion of the capacitance change.

Further, when the accelerometer of the present embodiment is used as an electrostatic servo type accelerometer, and when the movable electrode 5 tends to displace in response to an acceleration, a corresponding voltage is applied between the movable electrode 5 and the respective stationary electrodes 6 which induces an electrostatic force or a servo force necessary to maintain the movable electrode 5 at the center between the stationary electrodes 6, and the acceleration acted on is calculated based upon the applied voltage.

Figure 3:
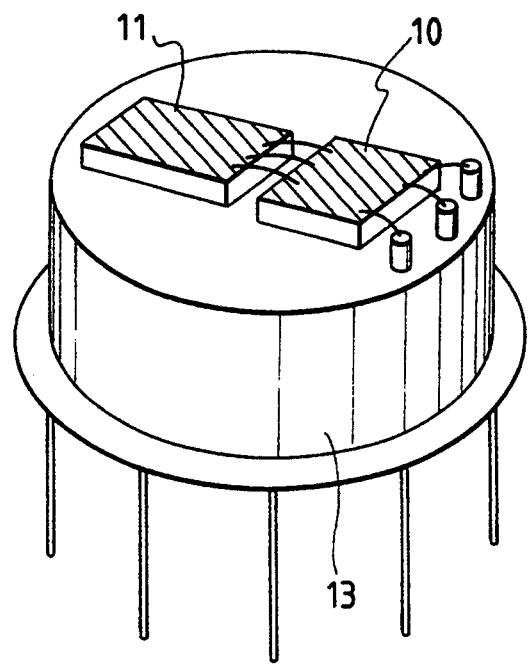
FIG. 3 is a perspective view showing a mounting state of the micro accelerometer shown in FIG. 1.

FIG. 3 shows a mounting state of the accelerometer shown in FIG. 1 and FIG. 2. An accelerometer chip 11 and the acceleration measurement circuit 10 as shown in FIG. 1 are bonded on a stem 13. Electrode pads at three locations for the movable electrode 5 and the upper and lower two stationary electrodes 6 on the accelerometer chip 11 and the acceleration measurement circuit 10 are connected via wire bondings, and electrode pads for input and output and for grounding of the acceleration measurement circuit 10 are connected to the corresponding external pins.

In the electrostatic type accelerometer thus constituted, when a high voltage is applied between the movable electrode 5 and the stationary electrodes 6 by some causes or when an external charged body touches one of electrode terminal and bonding pads and static electricity is charged between the movable electrode 5 and the stationary electrodes 6, a large electrostatic force acts on the both movable electrode 5 and the stationary electrodes 6.

At this instance, in the present embodiment, the insulator films 7 on the movable electrode 5 for the first time contact the equipotential electrodes 8. When the potential of the equipotential electrodes 8 is always set equal to that of the movable electrode 5, the voltage applied to the contacting portions is always zero so that no electric fields are generated and further even if a certain voltage is applied between the movable electrode 5 and stationary electrodes 6, the influence due to an electric field generated by the applied voltage over the insulator films 7 at the contacting portions is very small. As a result, after the electric field is removed, residual dielectric poralization and residual electric charges in the insulator films 7 are minimized and the attractive force acting between the insulator films 7 and the equipotential electrodes 8 is also reduced below the restoring force of the cantilever 4. Accordingly, the movable electrode 5 is separated from the equipotential electrodes 8 via the elastic restoring force of the cantilever 4.

Figure 4:
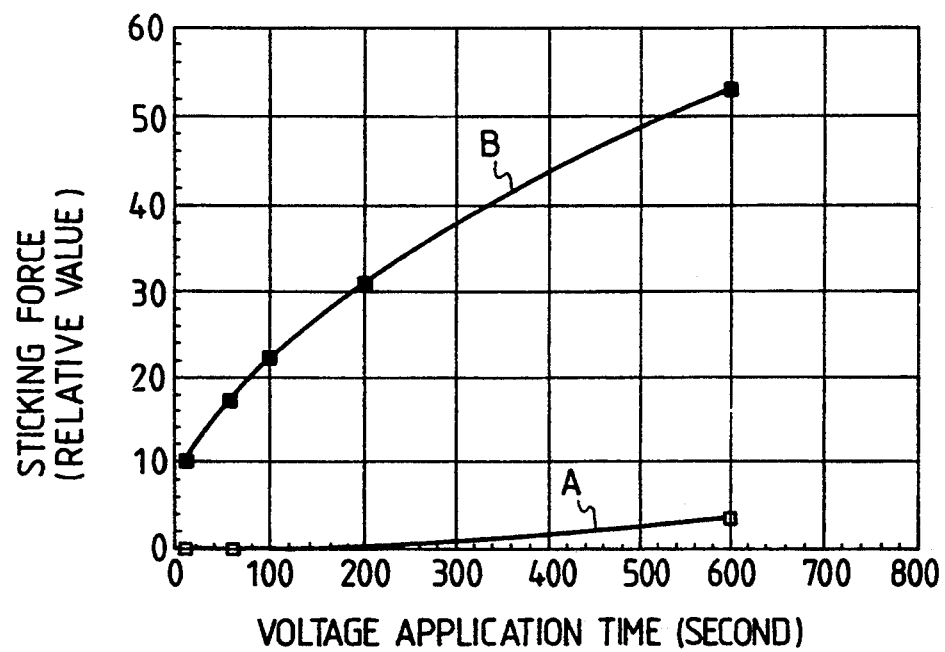
FIG. 4 is a diagram showing an experimental result on sticking force acting on the electrodes of the micro accelerometer as shown in FIG. 1 and a conventional one depending upon the time of voltage application on the electrodes.

FIG. 4 shows an experimental result on the variation of sticking forces acting on the movable electrode and the stationary electrodes when a voltage of 100 V is applied therebetween while changing the application time. The experiment was carried out on two accelerometers, one having the structure shown in FIG. 1 and FIG. 2 wherein the silicon movable electrodes is sized of 1.3 mm×1.8 mm and of 0.2 mm thick, the insulator films are made of silicon oxide of 50 μm square and are disposed on the four corners on the respective major surfaces of the movable electrode, the movable electrode is suspended by the two cantilevers each having a width of 250 μm, length of 800 μm and thickness of 13 μm, and the thin film stationary electrodes and the equipotential electrodes are formed on the respective Pyrex glass substrates so as to face the respective major surfaces of the movable electrode with respective gaps of 3 μm, and the other having the same dimension as above but excluding the equipotential electrodes. Curve A shows the experimental result with respect to the present embodiment and curve B shows the result with the conventional one with no equipotential electrodes. As will be apparent from the two curves, the sticking force acting on both electrodes in the accelerometer having the equipotential electrodes is reduced less than 1/10 of that having no equipotential electrodes. The above comparison result shows that the equipotential electrodes are very effective to reduce the sticking force.

Accordingly, the sticking of the movable electrode 5 to the opposing stationary electrode member 6 due to residual dielectric polarization and residual electric charges in the insulator films 7 is prevented and the malfunctioning of the accelerometer because of the sticking is eliminated. As a result, during the production of accelerometers, the yield thereof is improved and after mounting the accelerometers, the reliability thereof is enhanced.

Further, when a plurality of insulator films 7 are formed on the movable electrode 5, the equipotential electrodes 8 need not necessarily be formed so as to correspond to all of the insulator films 7. In an electostatic capacitive type accelerometer, the electrostatic capacitance between the electrodes is desirable to be as large as posible, and in an electrostatic servo type accelerometer, the electrostatic servo force acting between the movable electrode 5 and the stationary electrodes 6 is desirable to be as large as possible in order to obtain a broad acceleration measurement range. Accordingly in both types of accelerometers, the area of the equipotential electrodes 8, which do not contribute to increase the electrostatic capacitance and the electrostatic servo force, is desired to be decreased as much as possible.

Figure 5:
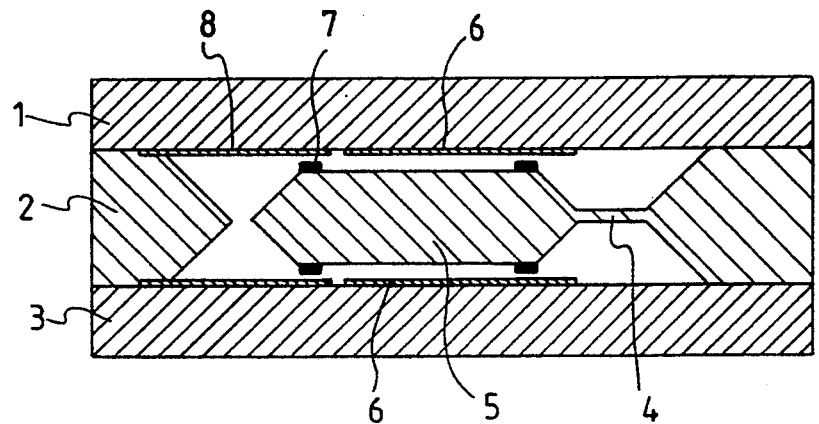
FIG. 5 is a cross sectional view of the second embodiment of micro accelerometers according to the present invention.

The second embodiment shown in FIG. 5 is constituted in view of the above, in that the equipotential electrodes 8 are formed only for the insulator films 7 located at the top end portions on the movable electrode 5, in other words the opposite side of the cantilever 4, among the insulator films 7 formed at the same locations as in the first embodiment shown in FIG. 1.

In this embodiment, the insulator films 7 on the movable electrode 5 located at the cantilever 4 side directly contact to the stationary electrodes 6.

In the structure as illustrated in FIG. 1 and FIG. 5 wherein the movable electrode 5 is supported at one side by the cantilever 4, when an external force perpendicular to the faces of the substrates 1, 2 and 3 acts on the movable electrode 5, the insulator films 7 at the top end on the movable electrode 5 initially contact to the respective equipotential electrodes 8 and the cantilever 4 deforms accordingly. The restoring force of the cantilever 4, in that the force tending to restore the movable electrode 5 to the center between the stationary electrodes 6, when all of the insulator films 7 contact to the stationary electrode member, is much larger than that when the insulator films 7 only at the top end on the movable electrode 5 contact to the stationary in electrode member because of the difference in displacement angles of the cantilever 4. Accordingly, a possible sticking force acting between the insulator films 7 and the stationary electrode member including the stationary electrodes 6 and the equipotential electrodes 8 is usually much smaller than the restoring force generated by the cantilever 4 when all of the insulator films 7 contact to the stationary electrode member so that such condition that all of the insulator films 7 stick to the stationary electrode member rarely happens. Therefore in that structure where the movable electrode 5 is supported at one side by the cantilever 4, the sticking between electrodes primarily happens at the insulator films 7 at the top end on the movable electrode 5. Accordingly, the sticking is fully prevented by providing the equipotential electrodes 8 explained in connection with the first embodiment only at the positions opposing the insulator films 7 disposed at the top end on the movable electrode 5. According to the second embodiment, the sticking between the electrodes is fully prevented while limiting the area of the equipotential electrodes 8 to be as small as possible.

Figure 6:
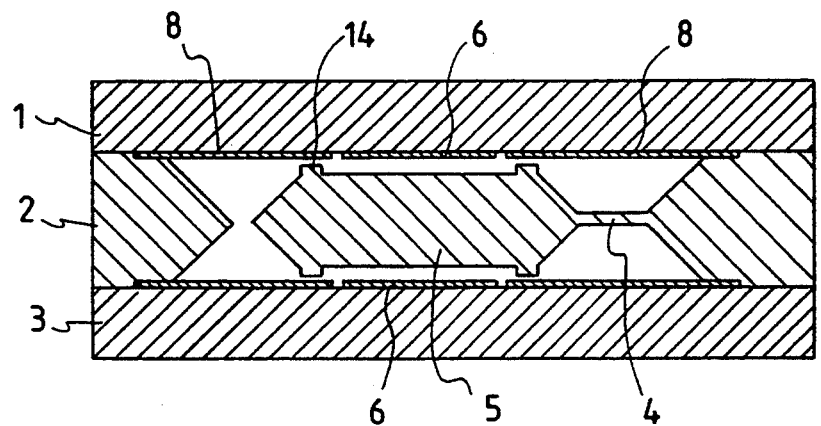
FIG. 6 is a cross sectional view of the third embodiment of micro accelerometers according to the present invention.

FIG. 6 shows the third embodiment according to the present invention wherein the insulator films 7 are omitted, instead, a part of the movable electrode 5 is designed to contact directly to the equipotential electrodes 8.

The insulator films 7 are initially designed to contact the surfaces of the stationary electrodes 6 prior to the movable electrode 5 when the movable electrode 5 excessively displaces, to thereby prevent electrical contact between the movable electrode 5 and the stationary electrodes 6 and to prevent short circuiting current flowing therebetween and further to prevent bonding by fusion therebetween caused by the short circuiting current. In the third embodiment omitting the insulator films 7, since the potential of the equipotential electrodes 8 is set equal to that of the movable electrode 5, no short circuiting current flows between the movable electrode 5 and the equipotential electrodes 8 even when the silicon on the surface of the movable electrode contacts directly to the equipotential electrodes 8 due to excess displacement of the movable electrode 5. In the present embodiment in order to contact initially the part of the movable contact 5 to the equipotential electrodes 8, silicon protrusions 14 are formed on the surfaces of the movable electrode 5.

As in the first, second and third embodiments explained above, the potential at the portions on the stationary electrode member, 6 where the insulator films 7 on the movable electrode member, 5 or the protruded parts of the movable electrode 5 itself contact when the movable electrode member excessively displaces, is always kept equal to that of the movable electrode 5. Therefore, the voltage applied at the contacting portions is always zero. Even when a certain voltage is applied between the movable electrode 5 and the stationary electrodes 6, the influence of the electric field applied at the insulator films 7 and the contacting portions of the movable electrode 5 is very small, thus the sticking between the electrodes due to residual dielectric polarization and residual electric charges is sufficiently prevented.

Figure 7:
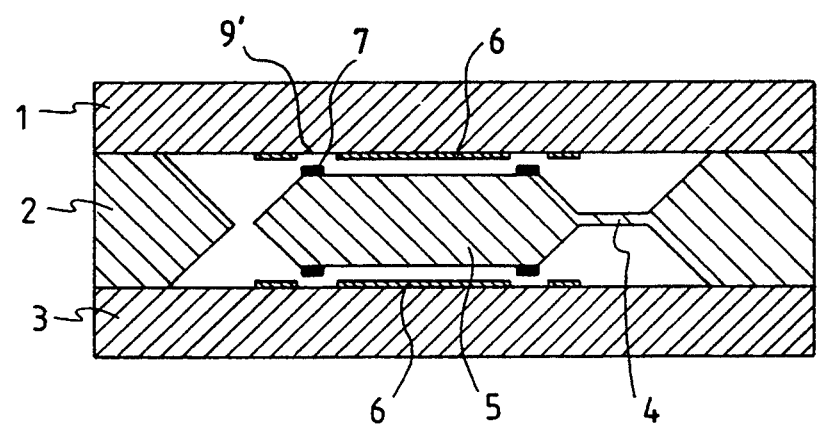
FIG. 7 is a cross sectional view of the fourth embodiment of micro accelerometers according to the present invention taken along the line II—II in FIG. 8.
Figure 8:
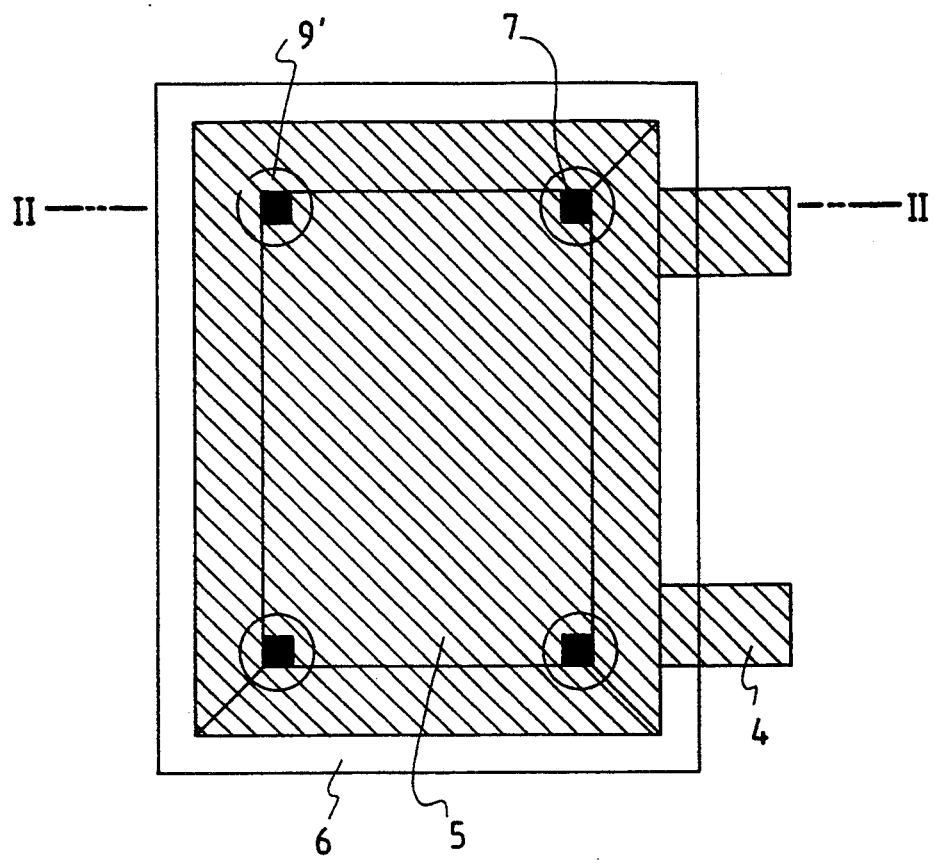
FIG. 8 is a plan view of the electrode portion of the fourth embodiment shown in FIG. 7.

FIG. 7 is a vertical cross sectional view of the fourth embodiment according to the present invention taken along the line II—II in FIG. 8, and FIG. 8 is a plan view of the movable electrode and one of the facing stationary electrodes of the fourth embodiment.

In FIG. 7 and FIG. 8, on the regions of the stationary electrodes 6, portions 9' are removed from of the stationary electrodes, (hereinafter called stationary electrode removing portions 9) and, are provided at the positions and their around which face the respective insulator films 7 on the movable electrode 5. At the stationary electrode removing portions 9', the surfaces of the substrates 1 and 3 are exposed.

In the electrostatic capacitive type or the electrostatic servo type accelerometer having such construction, when a high voltage is applied between the movable electode 5 and the stationary electrodes 6 by some causes or when an external electrically charged body contacts, for example, to the electrode terminals and the bonding pads, and static electricity is charged between the movable electrode 5 and the stationary electrodes 6, a large electrostatic attraction force acts between the movable electrode 5 and the stationary electrodes 6.

At this instance, in the present embodiment, the insulator films 7 on the movable electrode 5 contact the surfaces of the insulator substrates 1 and 3 via the stationary electrode removing portions 9'. At the time when the insulator films 7 are contacting the substrate 1 or 3, if the distance between the respective outer circumferences of the insulator films 7 and the respective surrounding circumferences of the stationary electrode removing portions 9' is sufficiently far in comparison with the thickness of the insulator films 7, the influence on the insulator films 7 due to the electric field generated between the movable electrode 5 and the stationary electrodes 6 is sufficiently small in comparison with the instance where no stationary electrode removing portions 9' are provided, in that the insulator films 7 directly contact to one of the stationary electrodes 6. As a result, after removing the electric field, residual dielectric polarization and residual electric charges in the insulator films 7 are reduced and the electrostatic attraction force acting between the insulator films 7 and the surfaces of the facing insulator substrate or the stationary electrode 6 reduces smaller than the restoring force by the cantilever 4. Thus the movable electrode 5 is separated from the stationary electrode 6 by the elastic restoring force of the cantilever 4.

Accordingly, the sticking of the movable electrode 5 to one of the stationary electrodes 6 due to residual dielectric polarization and residual electric charges in the insulator films 7 is prevented and the malfunctioning of the accelerometer because of the sticking is eliminated.

Figure 9:
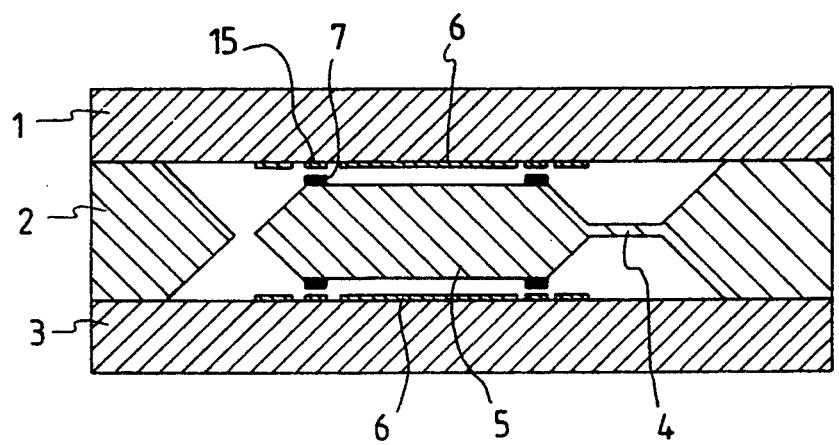
FIG. 9 is a cross sectional view of the fifth embodiment of micro accelerometers according to the present invention.

FIG. 9 shows a cross sectional view of the fifth embodiment according to the present invention having a similar construction as that of the fourth embodiment shown in FIG. 7 and FIG. 8, except that layer members 15 which are spaced apart and electrically isolated from the stationary electrode 6 are provided in the regions of the respective stationary electrode removing portions 9'. The layer member 15 may be either a conductive material or an insulating material. When an abnormally high voltage is applied between the movable electrode 5 and the stationary electrodes 6, and the movable electrode 5 excessively displaces, the insulator films 7 on the movable electrode 5 contact initially to the solid largers 15 to thereby prevent direct contact between the movable electrode 5 and one of the stationary electrodes 6. In this instance, since the layer members 15 are electrically isolated from the stationary electrode 6, like the fourth embodiment shown in FIG. 7 and FIG. 8, the influence on the insulator films 7 due to the electric field generated between the movable electrode 5 and one of the stationary electrodes 6 is sufficiently small in comparison with the instance wherein the insulator films 7 contact directly to one of the stationary electrodes 6.

Further, with regard to selection of material for the layer members 15, when the insulator films 7 contact the surfaces of the insulator substrate 1 or 3, physical force, other than the electrostatic attraction force such as liquid bridging force due to water is likely to act therebetween. A material having in addition a property to prevent such physical force such as hydrophobic polymers may be selected for the layer members 15, thereby the sticking between the movable electrode 5 and one of the stationary electrodes 6 is further surely prevented.

With the present embodiment, the sticking between the electrodes due to residual dielectric polarization and residual electric charges in the insulator films 7 is prevented and at the same time the sticking force due to the other physical forces is also reduced.

Further, described fourth and fifth embodiments in the above, the stationary electrode removing portions 9' are provided for all of the insulator films 7 disposed on the movable electrode 5. However in the same idea in the second embodiment explained above, it is unnecessary to form the stationary electrode removing portions 9' for all of the insulator films 7. Because in the electrostatic capacitive type or the electrostatic servo type accelerometer, it is desired to reduce the area of the stationary electrode removing portions 9', which do not contribute for increasing the electrostatic capacity or the electrostatic servo force, as much as possible.

Figure 10:
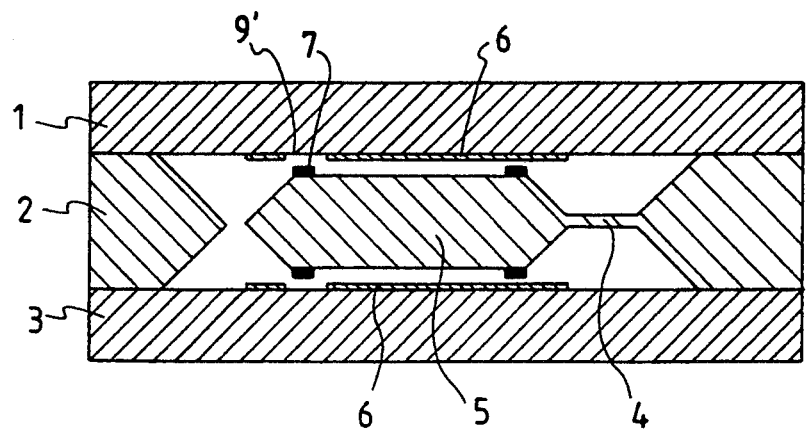
FIG. 10 is a cross sectional view of the sixth embodiment of micro accelerometers according to the present invention.

FIG. 10 is a cross sectional view of the sixth embodiment according to the present invention having a similar structure as the fourth embodiment shown in FIG. 7 and FIG. 8, except that the stationary electrode removing portions 9' are only provided for the insulator films 7 disposed at the top end on the movable electrode 5. In the structure wherein the movable electrode 5 is supported at one side by the cantilever 4, the sticking between the movable electrode 5 and one of the stationary electrodes 6 is primarily induced at the top end of the stationary electrode 5, therefore a similar sticking prevention effect is obtained if the stationary electrode removing portions 9' are formed only for the insulator films 7 located on the corresponding top end portions of the movable electrode 5.

Figure 11:
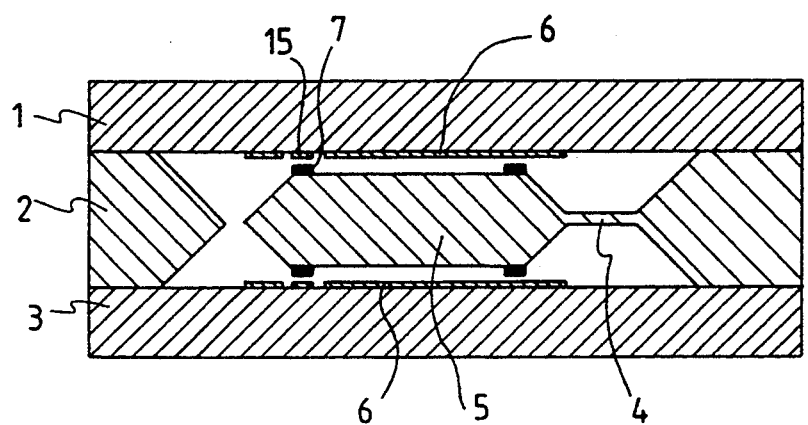
FIG. 11 is a cross sectional view of the seventh embodiment of micro accelerometers according to the present invention.

FIG. 11 is a cross sectional view of the seventh embodiment according to the present invention constructed based upon the same idea explained above, in that the stationary electrode removing portions 9' are formed only for the insulator films 7 located at the top end portions of the movable electrode 5 and the layer members 15 which are spaced apart and electrically isolated from the stationary electrode 6 are disposed in the regions of the stationary electrode removing portions 9'.

According to the sixth and seventh embodiments shown in FIG. 10 and FIG. 11, the sticking between the movable electrode 5 and one of the stationary electrodes 6 is prevented while limiting the area for the stationary electrode removing portions 9' to be as small as possible.

In the fourth, fifth, sixth and seventh embodiments explained above, since the stationary electrode removing portions 9' and the layer members 15 formed therein are electrically isolated from the stationary electrode 6, no short circuiting current flow through the portions on the movable electrode 15 which contact the stationary electrode removing portions 9' or the layer members 15, when the movable electrode 5 excessively displaces even if no insulator films 7 are provided on the movable electrode 5. Accordingly, the possible contacting portions on the movable electrode 5 may be the exposed silicon surfaces of the movable electrode 5 or may be provided with other conductive bodies.

Figure 12:
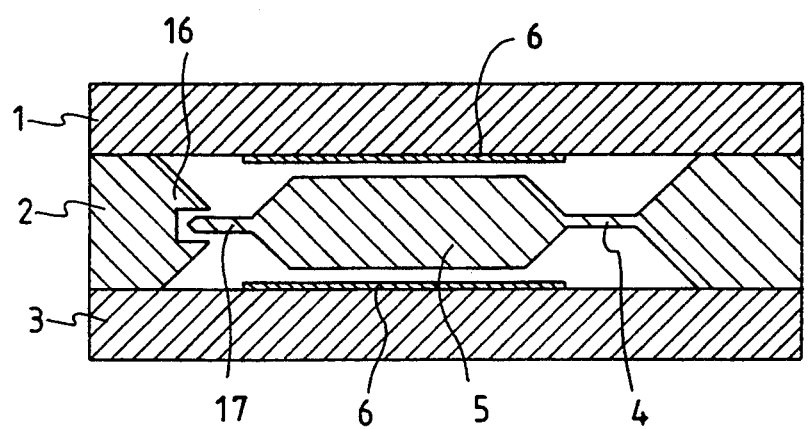
FIG. 12 is a cross sectional view of the eighth embodiment of micro accelerometers according to the present invention.

FIG. 12 is a cross sectional view of the eighth embodiment according to the present invention constructed based on the same idea of the third embodiment shown in FIG. 6. In the present embodiment, a stopper 16, which limits the displacement range of the movable electrode 5, is provided on the silicon substrate 2 having the equal potential as the movable electrode 5. When the movable electrode 5 displaces up to a predetermined extent, the movable electrode 5 contacts the stopper 16 prior to contacting one of the stationary electrodes 6, thereby an excessive displacement of the movable electrode 5 is prevented. More specifically, at the top end of the movable electrode 5, there is provided a protrusion 17 and on the facing silicon substrate 2 the stopper 16 is formed of a channel shape which limits upward and downward displacement of the protrusion 17 within a predetermined range.

According to the present embodiment, via the cooperation of the stopper 16 and the protrusion 17, the contacting between the movable electrode 5 and one of the stationary electrodes 6 is prevented, thereby no insulator films 7 are needed to be provided on the movable electrode 5 and further, no voltages are applied at the contacting portion between the stopper 16 and the protrusion 17. Moreover, even when an abnormally high voltage is applied between the movable electrode 5 and the stationary electrodes 6, influence on the both electrodes due to the electric field generated by the applied voltage is very small so that the sticking between the movable electrode 5 and one of the stationary electrodes 6 rarely happens.

Reduction of electric field strength applied on the insulator films 7 on the movable electrode 5 is also realized by modifying the configuration of the insulator films 7. Electric field strength in the insulator films 7 decreases dependent upon the distance increase between the movable electrode 5 and the stationary electrodes 6. Accordingly, it is preferable to modify the configuration of the insulator films 7 so that the distance between the movable electrode 5 and the stationary electrodes 6 at the possible contacting portions becomes as large as possible when both electrodes 5 and 6 contact via the insulator films 7.

Figure 13:
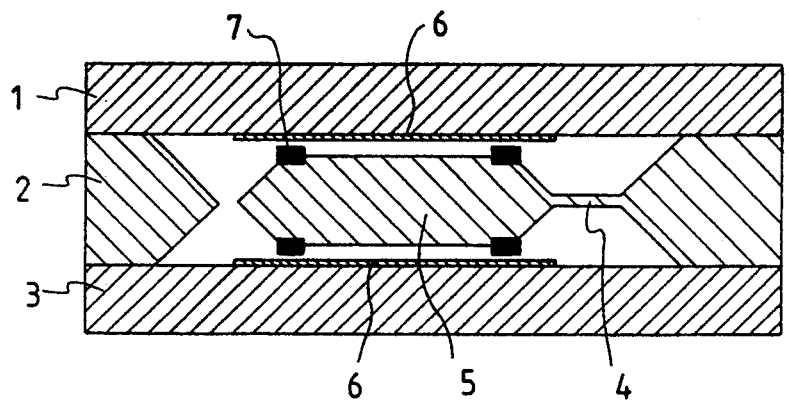
FIG. 13 is a cross sectional view of the ninth embodiment of micro accelerometers according to the present invention.

The most simple approach is to increase the thickness of the insulator films 7, because the electric field applied thereto reduces in a manner of inverse propotion. However, insulator films 7 having thickness more than the gap distance between the movable electrode 5 and the stationary electrodes 6 can not be used if no measures are taken on the movable electrode 5. FIG. 13 is a cross sectional view of the ninth embodiment according to the present invention wherein the insulator films 7 are disposed on dug planes on the surfaces of the movable electrode 5 while protruding the facing surfaces of the insulator films 7 above the non dug planes of the movable electrode 5 to thereby increase the thickness of the inslator films 7.

Figure 14:
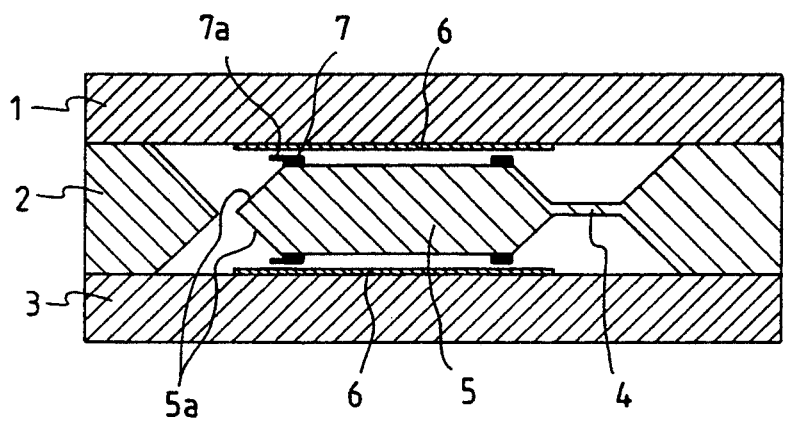
FIG. 14 is a cross sectional view of the tenth embodiment of micro accelerometers according to the present invention.

FIG. 14 is a cross sectional view of the tenth embodiment according to the present invention, in which a horizontal protrusion 7a is provided for the respective insulator films 7 located at the top end on the movable electrode 5 and the respective horizontal protrusions 7a are adapted to contact initially to one of the stationary electrodes 6 to thereby prevent the contacting between the movable electrode 5 and one of the stationary electrodes 6. Further, since the top end of the movable electrode 5 is formed in a taper shape via inclined surfaces 5a, the distance between the possible contacting portion of a horizontal protrusion 7a on the stationary electrode 6 and the movable electrode 5, in that the inclined surface 5a increases, thereby the electrical field strength near the insulating films 7 is reduced when the movable electrode 5 contacts to one of the stationary electrodes 6 via the insulator films 7. Accordingly, after the electric field is removed residual dielectric polarization and residual electric charges in the insulator films 7 are sufficiently reduced and the sticking between the electrodes is eliminated.

According to the ninth and tenth embodiments explained above, via the modification of configuration of the insulator films 7 and the movable electrode 5 the sticking between the electrodes is prevented.

Even when static electricity is accummulated on the electrodes if no potential difference appears between the movable electrode and the stationary electrodes, no problems arise.

Figure 15:
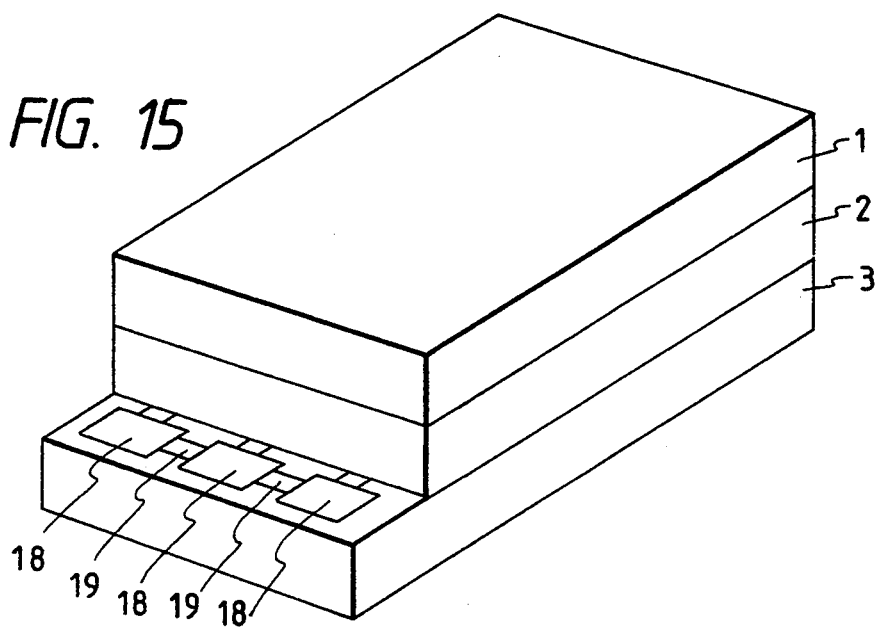
FIG. 15 is a perspective view of the eleventh embodiment of micro accelerometers according to the present invention.

FIG. 15 is a perspective view of the eleventh invention according to the present embodiment which is constructed based upon the above idea wherein pad portions 18 for the movable electrode 5 and the stationary electrodes 6 are mutually connected by leads 19 in order to maintain the potentials of both electrodes 5 and 6 equal until the accelerometer is mounted. As a result, the sticking of the movable electrode 5 to one of the stationary electrodes 6 due to electrostatic attraction force before mounting thereof is prevented. The connection between pads 18 can be disconnected by making use of for example, laser beams after the mounting thereof as illustrated in FIG. 3. Since the pads 18 are connected to the acceleration measurement circuit 10 after the accelerometer has been mounted, when a proper measure for static electricity is provided in the circuit, application of an abnormally high voltage or charging of static electricity onto the accelerometer chip 11 is prevented and the sticking between electrodes due to static electricity is eliminated.

According to the present embodiment, the sticking between electrodes due to charging of static electricity is prevented without modifying the structure of the electrode member but with modifying simply the wiring condition of the pad portions.

Other than modifying the structure of the electrode members as in the preceeding embodiments, the sticking between the electrodes is prevented by modifying the material of the insulator films 7.

For reducing residual dielectric polarization and residual electric charges in the insulator films 7, materials such dry silicon oxide and thermal silicon nitride are more preferable for the insulator films 7 than silicon oxide prepared by for example steam oxidation. However, if the silicon oxide prepared by the steam oxidation is heat treated thereafter at a temperature of about 1000° C., internal defects therein are reduced and resistances to residual dielectric polarization and residual electric charges are increased.

Figure 16:
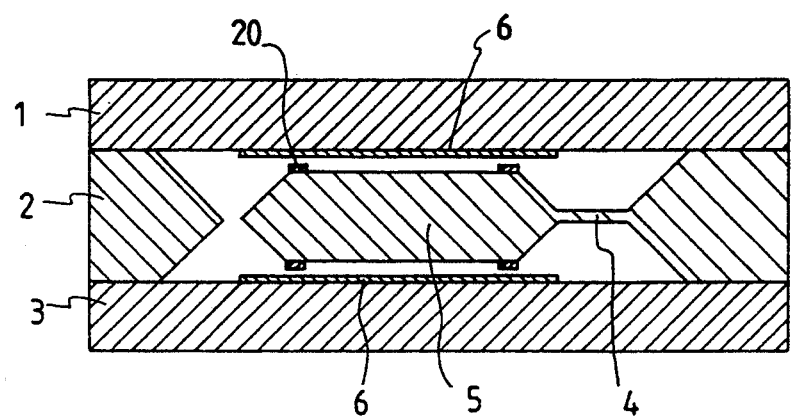
FIG. 16 is a cross sectional view of the twelfth embodiment of micro accelerometers according to the present embodiment.

FIG. 16 is a cross sectional view of the twelfth embodiment according to the present invention wherein high resistance films 20 are formed on the movable electrode 5 in place of the insulator films 5 in the preceeding embodiments and the high resistance films 20 are designed to initally contact one of the stationary electrodes 6 when the movable electrode 5 excessively displaces. These high resistance films 7 can be disposed on the stationary electrodes instead of on the movable electrode 5.

With the accelerometer thus constituted, when the movable electrode 5 excessively displaces during the use thereof and contacts one of the stationary electrodes 6, such contacting is performed via the high resistance films 20 such that the short circuiting current flowing therebetween is limited and the bonding by fusion between the electrodes 5 and 6 is prevented. Further, since no insulator films 5 are used, electrostatic attraction forces between the electrodes 5 and 6 due to residual dielectric polarization and residual electric charges in the insulator films 7 are generated, accordingly the sticking between the electrodes caused thereby is prevented.

On the other hand, sticking due to water adsorbed or condensated on possible contacting surfaces of the movable electrode member and the stationary electrode member of accelerometers is prevented such as by evacuating an internal space 21 (see FIG. 1) of the accelerometer surrounding for example, the movable electrode 5, the stationary electrodes 6, insulator films 7, the equipotential electrodes 8, layer member 15, and high resistance films 20, by sealing a dry gas in the space 21, by forming at least the possible contacting surfaces with a hydrophobic material, and by applying a chemical hydrophobic treatment at least on the possible contacting surfaces. Accordingly the amount of adsorbed and condensated water on the possible contacting surfaces is reduced and, the sticking force due to water is reduced, thereby the sticking between the electrodes is further prevented.

Figure 17:
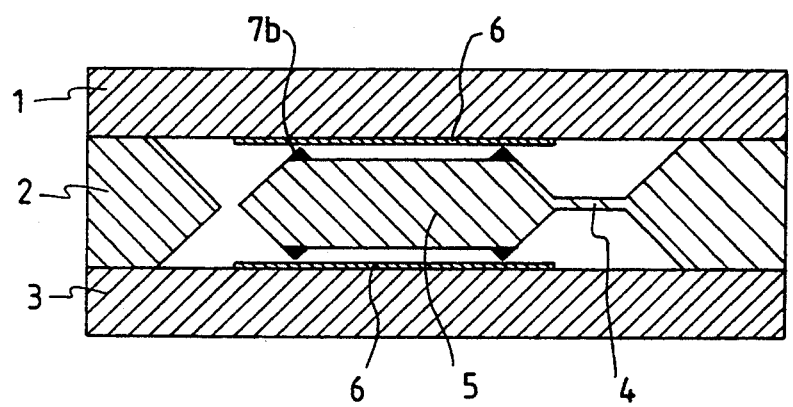
FIG. 17 is a cross sectional view of the thirteenth embodiment of micro accelerometers according to the present invention taken along the line III—III in FIG. 18.
Figure 18:
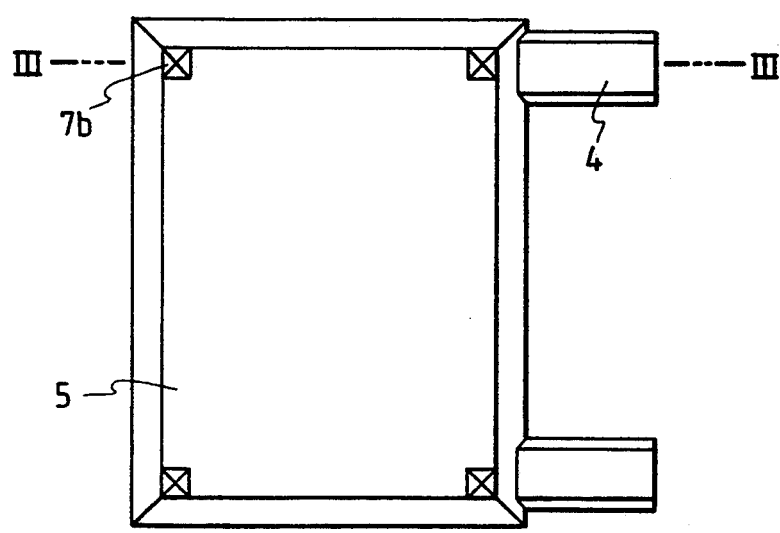
FIG. 18 is a plan view of the movable electrode and the cantilever portions in the thirteenth embodiment shown in FIG. 17.

FIG. 17 is a cross sectional view of the thirteenth embodiment according to the present invention taken along the line III—III in FIG. 18, and FIG. 18 is a plan view of the movable electrode and the cantilever portions in FIG. 17.

In the thirteenth embodiment, conical or pyramid shaped protrusions 7b made of an electrical insulator material and having a very small top area are disposed on a part of the surfaces of the movable electrode 5. In the present embodiment, four right pyramid shaped insulator protrusions 7b are formed at the four corners on the respective major surfaces of the movable electrode 5. These insulator protrusions 7b contact the surface of one of the stationary electrodes 6 prior to the movable electrode 5 when the movable electrode 5 excessively displaces.

When a large external force acts on the movable electrode 5 during handling or operation of the accelerometer and the movable electrode 5 excessively displaces and the insulator protrusions 7b contact the surface of one of the stationary electrodes 6, and a physical attraction force may be caused therebetween. However, since the insulator protrusions 7b have a pyramid shape as illsurated in FIG. 17 and FIG. 18, the contacting area S of the insulator Protrusions 7b with the surface of the stationary electrode 6 is very small so that even if the physical attraction force fs acting on a unit area in the contacting portions is relatively large, the total sticking force Fs=fs×S is reduced, thereby the sticking between the electrodes 5 and 6 is prevented. The top portion of, such as a circular cone and a pyramid, is a point from mathematical point of view, although the top portion of an actually formed circular cone and pyramid has a small plane or spherical surface. However, when the total sticking force Fs is controlled to be smaller than the external forces which tend to release the sticking force acting on the electrodes such as the restoring force by the cantilever 4 and the electrostatic servo force, the sticking never happens.

Figure 19:
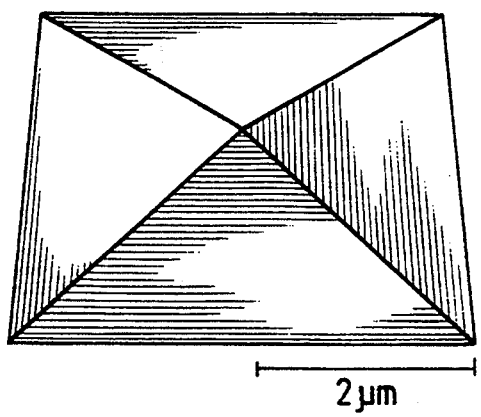
FIG. 19 is a schematic perspective view of the insulator protrusion in the thirteenth embodiment shown in FIG. 17 drawn based upon a SEM photograph thereof.
Figure 20:
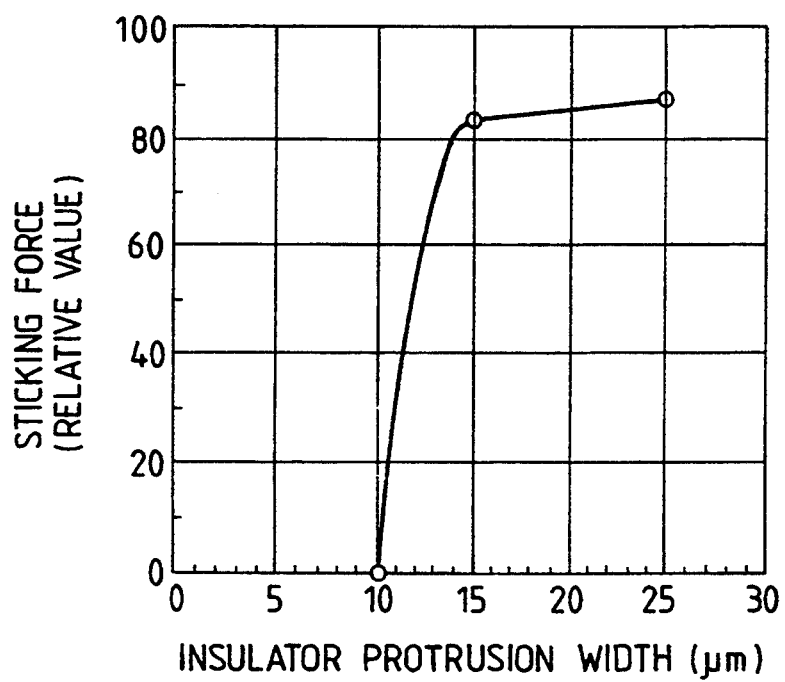
FIG. 20 is a diagram showing an experimental result on sticking force acting on the electrodes of the micro accelerometer as shown in FIG. 17 depending upon the width of the insulator protrusion formed on the surface of one of the electrodes.

FIG. 19 shows a perspective view of the pyramid shaped protrusion 7b of silicon oxide formed on the movable electrode 5 drawn with reference to an SEM phtograph thereof. FIG. 20 shows an experimental result of the relationship between the sticking force and the width of the insulator protrusion, in that length in the direction perpendicular to the axis of the cantilever 4. From the drawing, it will be seen that when the width of the insulator protrusion is selected below 15 $\mu$m the sticking force suddenly decreases and further when the width is selected below 10 $\mu$m the sticking force reduces to a negligibly small amount with respect to the restoring force of the cantilever 4.

In the present embodiment, the insulator protrusions 7b of, such as a circular cone and a pyramid shape, are exemplified, however the purpose of introducing such insulator protrusions is to reduce the contacting area S with the opposing electrode surface, therefore the shape of the insulator protrusion is not limited to a circular cone and a pyramid shape as in the previous embodiment if such has a small top area. However in view of easy production and mechanical strength thereof, an insulator protrusion having a larger bottom area and a smaller top area is preferable.

Figure 21:
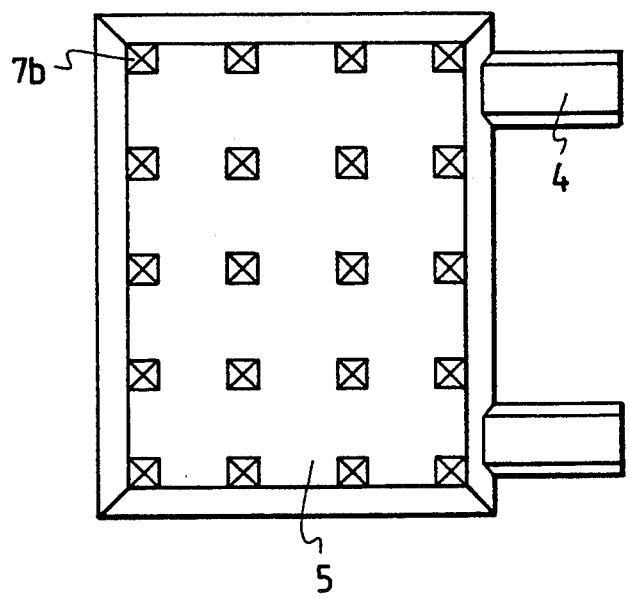
FIG. 21 is a plan view of the movable electrode and cantilever portions of the fourteenth embodiment of micro accelerometers according to the present invention which are used in place of those shown such as in FIG. 17 and FIG. 18.

Further, the number of the insulator protrusions 7b on one major surface of the movable electrode 5 is not limited to four as in the embodiment shown in FIG. 18. FIG. 21 is a plan view Of the movable electrode and the cantilever of the fourteenth embodiment according to the present invention wherein the number of insulator protrusions 7b having a larger bottom area and a smaller top area is increased in view of their mechanical strength, with the present embodiment, the sticking between the electrodes is likely prevented, as a result, yield during production thereof is improved and operational reliability after mounting thereof is enhanced. In the present embodiment, the insulator protrusions 7b are uniformly distributed over the surfaces of the movable electrode 5, however the insulator protrusions 7b are not necessarily distributed uniformly as in the present embodiment.

As explained in connection with the second embodiment shown in FIG. 5, in the structure where the movable electrode 5 is supported at one side by the cantilevers 4, the sticking between the electrodes primarily happens at the insulator protrusions 7b located at the top end on the movable electrode 5. Accordingly the sticking is sufficiently prevented only by disposing the insulator Protusions 7b having a small top area at the top end portions on the movable electrode 5.

Figure 22:
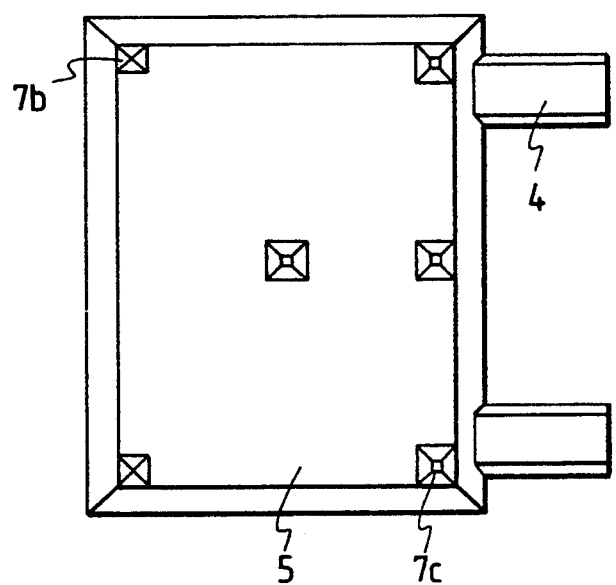
FIG. 22 is a plan view of the movable electrode and cantilever portions of the fifteenth embodiment of micro accelerometers according to the present invention which are used in place of those shown such as in FIG. 17 and FIG. 18.
Figure 23:
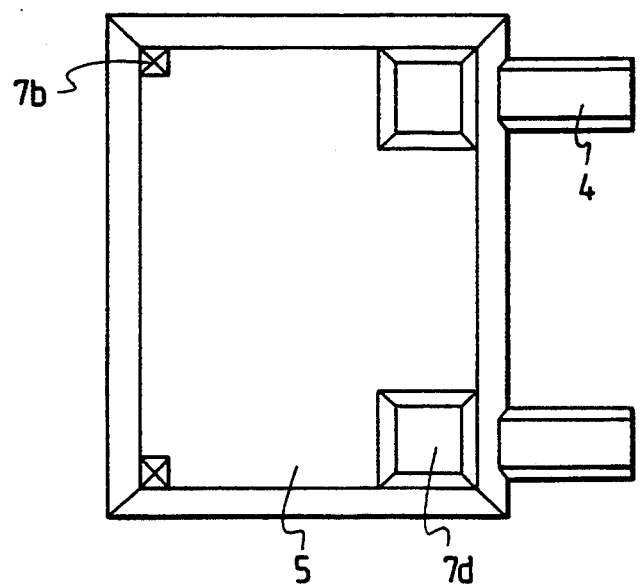
FIG. 23 is a plan view of the movable electrode and cantilever portions of the sixteenth embodiment of micro accelerometers according to the present invention which are used in place of those shown such as in FIG. 17 and FIG. 18.

FIG. 22 and FIG. 23 show respectively cross sectional views of fifteenth and sixteenth embodiments according to the present invention which are constructed in view of the idea explained above, in that in view of the mechanical strength of the insulator protrusions when an exessive external force acts on the movable electrode and the insulator protrusions are pressed onto the stationary electrode with a large force. When such excessively large external force acts on the movable electrode, all of the insulator protrusions on the movable electrode are pressed onto the stationary electrode. However, since the insulator protrusions located at the cantilever side do not directly relate to the sticking prevention as explained above, there are no problems if the contacting area of the insulator protrusions at the cantilever side with the stationary electrode is increased to some extent. In the fifteenth embodiment shown in FIG. 22, a plurality of insulator protrusions 7c, which have somewhat larger top area than that disposed at the top end portion on the movable electrode 5, are provided at the cantilever side on the movable electrode 5, and in the sixteenth embodiment shown in FIG. 23, two insulator protrusions 7d having a further larger top area disposed on the two corners at the cantilever side.

With the accelerometers of the fifteenth and sixteenth embodiments wherein the movable electrode 5 is supported at one side by cantilevers and the top contacting area of the insulator protrusions or the insulator films at the cantilever sides on the movable electrode 5 is enlarged, when a large external force acts on the movable electrode 5 such as because an execessively large acceleration due to a mechanical shock is applied to the accelerometer, the substantial portion of the force is applied to the insulator protrusions 7c or 7d at the cantilever side and the burden of insulator protrusions 7b having a small top area located at the top end of the movable electrode 5 is reduced. Thereby the breakdown of the insulator protrusions 7b located at the top end portions on the movable electrode 5 have an important function for the sticking prevention. Namely, in these embodiments, the function of the sticking prevention is primarily assigned to the protrusions 7b located at the top end portions on the movable electrode 5 and the function of maintaining mechanical strength is primarily assigned to the protrusions 7c or 7d located at the cantilever side on the movable electrode 5.

As explained above, for preventing the sticking phenomenon between the electrodes, it is sufficient if the contacting area of the insulator protrusions located at the top end portions on the movable electrode 5 is reduced and it is not necessary to reduce the top area of all of the insulator protrusions on the movable electrode 5.

Figure 24:
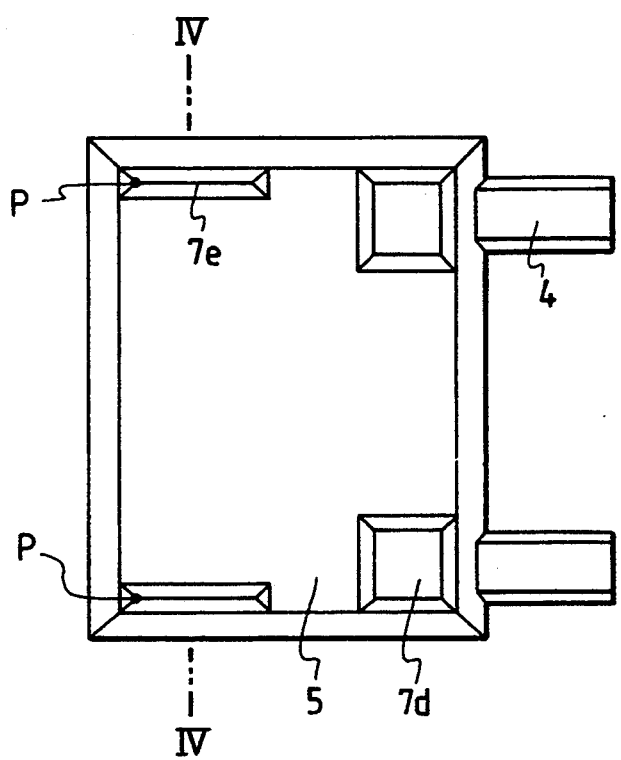
FIG. 24 is a plan view of the movable electrode and cantilever portions of the seventeenth embodiment of micro accelerometers according to the present invention which are used in place of those shown such as in FIG. 17 and FIG. 18.
Figure 25:
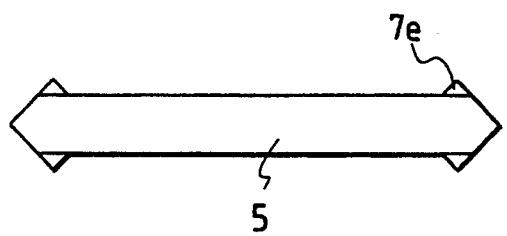
FIG. 25 is a cross sectional view taken along the line IV—IV in FIG. 24.

FIG. 24 is a plan view of the movable electrode and the cantilever portions of the seventeenth embodiment according to the present invention and FIG. 25 is a cross sectional view taken along the line IV—IV in FIG. 24, wherein a pair of insulator protrusions 7e having a configuration like a triangular prism are disposed at the two corners at the top end on the respective major surfaces of the movable electrode 5 while aligning the axes of the triangular prism shaped insulator protrusions 7e with the axis of the cantilever. In the present embodiment, the top end portions P on the insulator protrusions 7e initially contact to the stationary electrode so that the sticking which possibly occurs is at the top end portions thereby a small contacting area is also maintained. Further, when an excessively large force acts on the movable electrode 5, the large force is supported by the ridges of the insulator protrusions 7e and the insulator protrusions 7d disposed at the cantilever side on the movable electrode 5, thereby the contacting area is increased and the mechanical strength of the insulator protrusions againt an excessively large external force is maintained.

Figure 26:
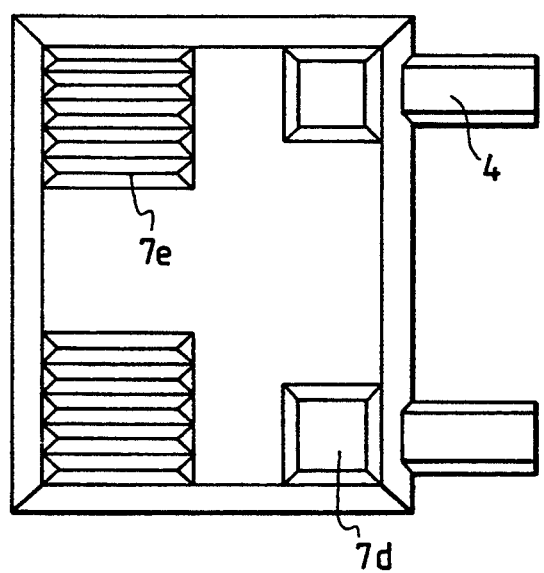
FIG. 26 is a plan view of the movable electrode and cantilever portions of the eighteenth embodiment of micro accelerometers according to the present invention which are used in place of the those shown such as in FIG. 17 and FIG. 18.

FIG. 26 is a plan view of the movable electrode and the cantilever portions of the eighteenth embodiment according to the present invention wherein the number of triangular prism like insulator protrusions 7e is increased, thereby the mechanical strength of the insulator protrusions is further increased.

The configuration of the insulator protrusion 7e is not limited to the triangular prism like shape if the insulator protrusion contacts the stationary electrode via point contacts or the like, accordingly the insulator protrusion 7e may be a semicolumn shape or a pentagonal prism shape.

Figure 27:
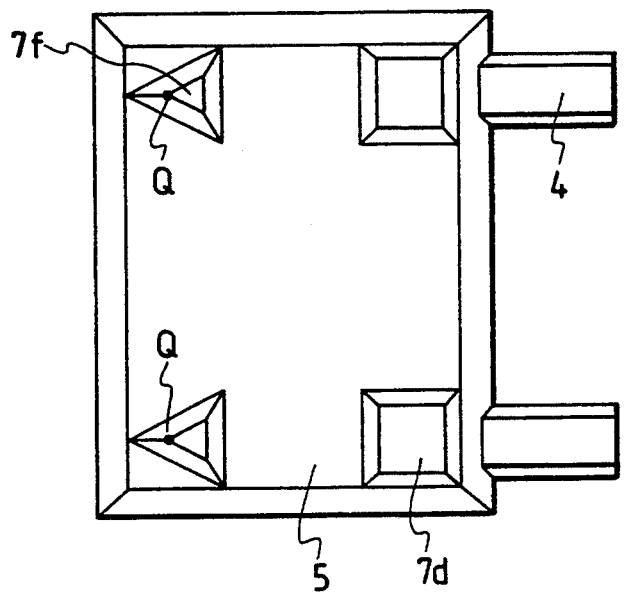
FIG. 27 is a plan view of the movable electrode and cantilever portions of the nineteenth embodiment of micro accelerometers according to the present invention which are used in place of those shown such as in FIG. 17 and FIG. 18.
Figure 28:
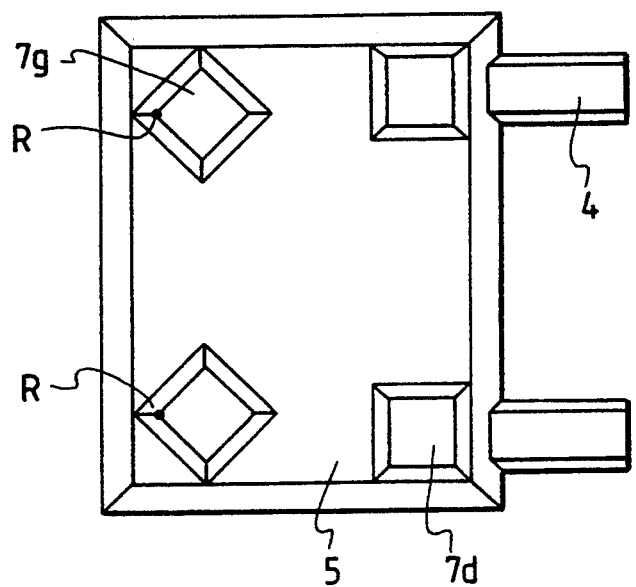
FIG. 28 is a plan view of the movable electrode and cantilever portions of the twentieth embodiment of micro accelerometers according to the present invention which are used in place of those shown such as in FIG. 17 and FIG. 18.

FIG. 27 and FIG. 28 are respectively the movable electrode and cantilever portions of the nineteenth and twentieth embodiments according to the present invention. In the nineteenth embodiment shown in FIG. 27, a pair of insulator protrusions 7f having a truncated triangular pyramid shape are disposed at the top end portions on the movable electrode 5 and in the twentieth embodiment shown in FIG. 28 a pair of insulator protrusions 7g having a truncated pyramid shape are disposed at the top end portions on the movable electrode 5. In both embodiments only the top end portions Q and R of the insulator protrusions 7f and 7g and therearound contact the stationary electrode, thereby a small contacting area is also maintained like the seventeenth embodiment shown in FIG. 24 and FIG. 25. In these embodiments, even if the truncated top areas of the insulator protrusions 7f and 7g are formed relatively large, the possible sticking portions of the insulator protrusions to the stationary electrode are always limited to the top end portions Q and R and therearound, the sticking between electrodes is prevented like the previous embodiments. Further, the insulator protrusions 7f and 7g are easily produced and the configuration thereof is hardly affected by the size variation during production. The shape of the truncated top face of the insulator protrusions 7f and 7g is not limited to triangle and quadrangle shapes, but any shapes are acceptable if there is provided an angled portion at the top end of the respective truncated top faces which defines a contacting point with the stationary electrode.

In the above embodiments, the insulator protrusions 7b, 7c, 7d, 7e, 7f and 7g, and the insulator films 7 are disposed on the movable electrode 5, however these insulator protrusions and the insulator films can be formed on the stationary electrode at the corresponding locations with the same advantage explained above.

Now, in preventing of sticking between electrodes by means way roughening the surface of solid body, one of is to apply a texture processing on the surface of the movable electrode or the stationary electrodes by photolithography to form a microscopic uneven surface thereon.

Figure 29:
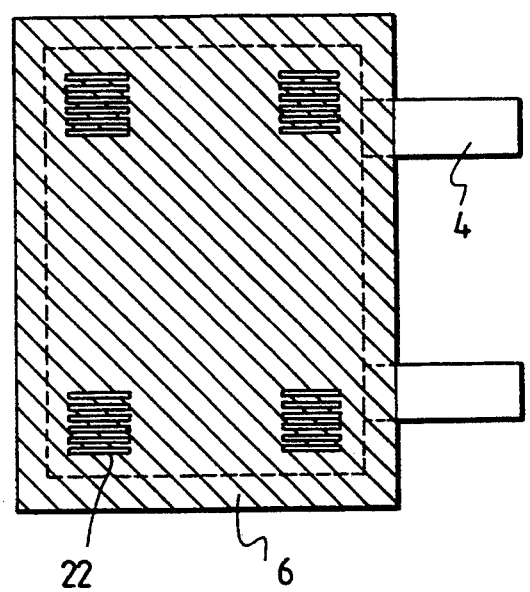
FIG. 29 is a plan view of the stationary electrode of the twenty-first embodiment of micro accelerometers according to the present invention which is used in place of that shown such as in FIG. 13.

FIG. 29 is a plan view of the stationary electrode of the twenty-first embodiment according to the present invention wherein a plurarity of patterns 22 having slits of which direction is arranged in parallel with the axis of the cantilever 4 are formed on the stationary electrode 6 at the positions facing the respective insulator films 7 formed on the movable electrode 5. The width of the respective microscopic slits is selected to be about 1 μm or therebelow and the contacting area reduces in propotion to the number of the slits.

A structure obtained by applying the microscopic texture processing to the surface of the movable electrode 5 is analogous to the eighteenth embodiment shown in FIG. 26.

The roughening of the surface of the movable electrode or the stationary electrodes is also achieved by polishing the surface thereof with abrasives. When a texture processing, which provides a muliplicity of microscopic slits having a pitch of one micron order or therebelow and a depth of more than several nanometers by properly selecting the grain diameter of the abrasives, is applied at least on and near the possible contacting surfaces of the movable electrode or the stationary electrodes, the sticking between the electrodes is also prevented.

Further, when the electrodes and the insulator films are formed by a thin film forming process such as sputtering and a CVP, a film having an uneven surface is easily formed by properly selecting the thin film forming condition. When an uneven surface having a pitch of one micron or therebelow and a depth of more than several nanometers is formed on the movable electrode or the stationary electrodes, the sticking between electrodes is sufficiently prevented. Such an uneven surface can likely be formed by etching or by back-sputtering.

With regard to the silicon substrate itself, an uneven surface of silicon is formed by subjecting the silicon monocrystalline to anodic formation in a hydrofluoric acid water solution to obtain porous silicon.

Figure 30:
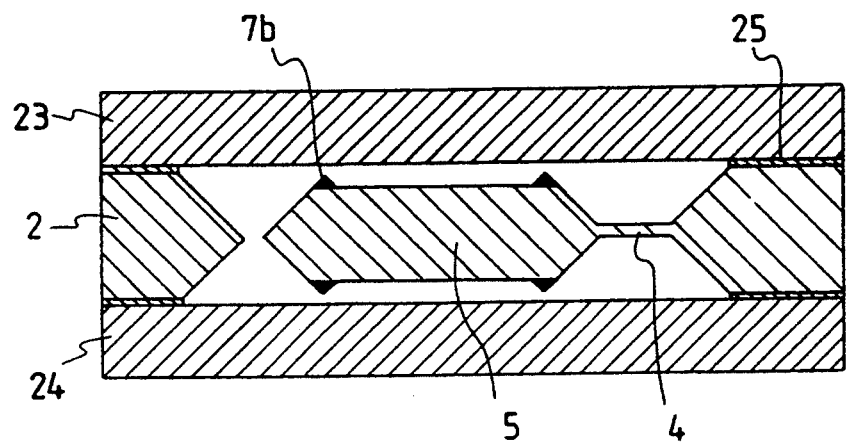
FIG. 30 is a cross sectional view of the twenty-second embodiment of micro accelerometers according to the present invention.

In the accelerometers of the previous embodiments, the entire portion of the substrates 1 and 3 or at least the portion facing the substrate 2 is formed of an insulator material, however the measures for preventing the sticking between the electrodes which are applied to the previous embodiments are also applicable to an accelerometer shown in FIG. 30 in which the upper and lower substrates corresponding to the substrates 1 and 3 in the previous embodiments are made of silicon, in which the silicon surfaces of the two silicon substrates 23 and 24 facing the movable electrode 5 are barely exposed and serves as the stationary electrodes. Insulator layers 25 made of for example, glass and silicon oxide is interposed between the respective adjacent silicon substrates 5, 23 and 24 to electrically isolate each other.

For the accelerometer having the three layered structure of silicon/silicon/silicon as explained above, the structure applied to the embodiments explained in connection with the eighth embodiment shown in FIG. 12 and thereafter are also applicable without substantial modification.

FIG. 30 is one of such examples corresponding to the thirteenth embodiment shown in FIG. 17 and shows a cross sectional view of the twenty-second embodiment according to the present invention wherein the insulator protrusions 7b having a small top area are provided on the movable electrode 5.

Analogous to the twenty-first embodiment shown in FIG. 29, on the surfaces of the silicon substrates 23 and 24 facing the respective insulator protrusions 7b, muliplicity of microscopic unevennesses can be formed by etching to prevent the sticking.

Figure 31:
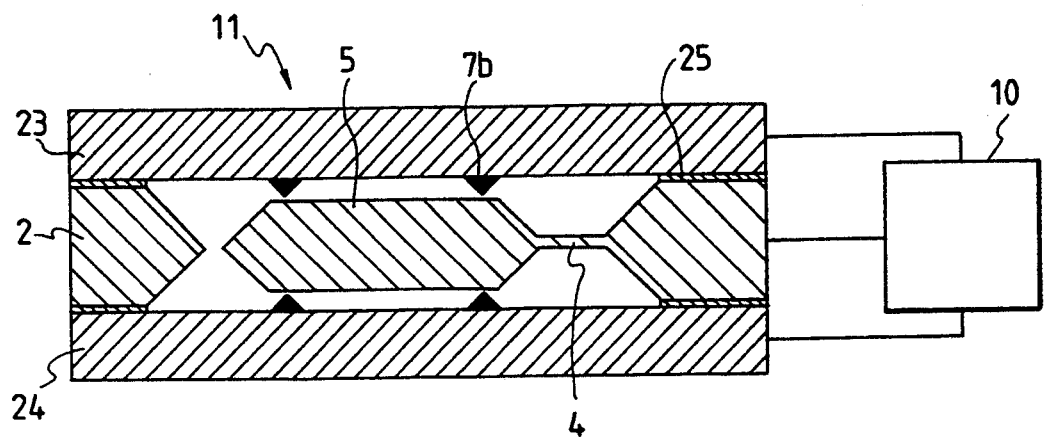
FIG. 31 is a cross section view of the twenty-third embodiment of micro accelerometers according to the present invention.
Figure 32:
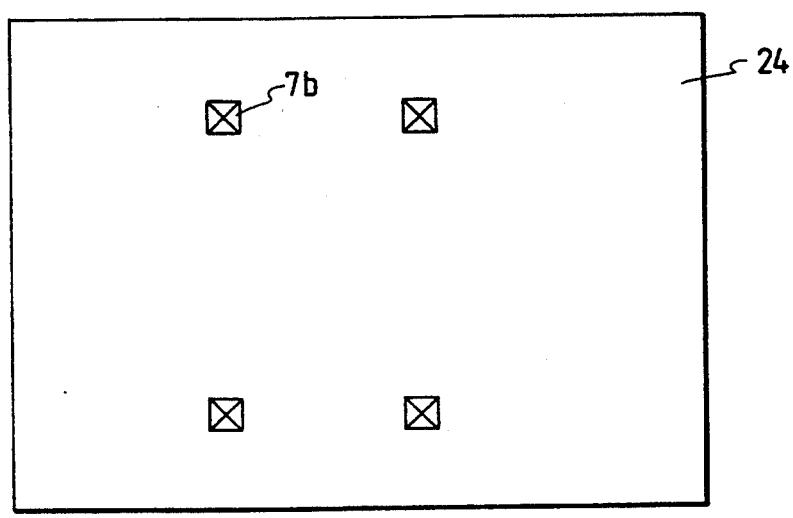
FIG. 32 is a plan view of the stationary electrode of the twenty-third embodiment shown in FIG. 31.

FIG. 31 is a cross sectional view of the twenty-third embodiment according to the present invention and FIG. 32 is a plan view of one of the stationary electrode silicon substrates in FIG. 31, wherein the insulator protrusions 7b are disposed on the sides of the stationary electrode silicon substrates 23 and 24 contrary to the twenty-second embodiment shown in FIG. 30.

In the above embodiments and their modifications, the embodiments from the first to the twelfth and their modifications are directed to measures to eliminate or reduce the causes inducing the sticking between the electrodes such as residual dielectric polarization, residual electric charges and water at the vicinity of the possible contacting portions on the movable and stationary electrodes in order to reduce the attraction force acting between both electrodes, and the embodiments from the thirteenth to the twenty-third are directed to measures to reduce the contacting area of the possible contacting portions of the movable and stationary electrodes in order to reduce the attractive force possibly acting between both electrodes.

Figure 33:
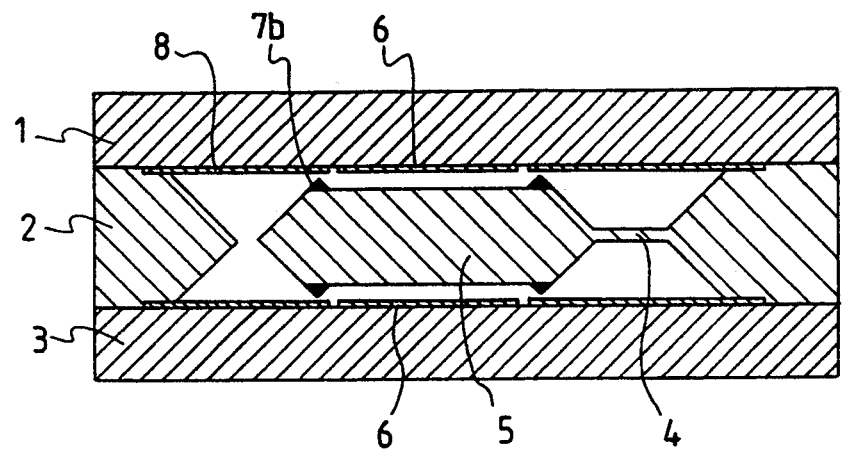
FIG. 33 is a cross sectional view of the twenty-fourth embodiment of micro accelerometers according to the present invention.

When combining the two types of measures, the electrode sticking prevention effect is further enchanced. FIG. 33 is a cross sectional view of the twenty-fourth embodiment according to the present invention in which the measure in the first embodiment shown in FIG. 1 and the measure in the thirteenth embodiment shown in FIG. 17 are combined.

Hereinabove, the sticking prevention of the movable electrode and the stationary electrode is explained with reference to accelerometers wherein the movable electrode is supported at one side by the cantilevels, however the present invention is not limited to such structure, the present embodiments are also applicable to such accelerometers wherein the movable electrode is supported from the four sides by beams or by a diaphragm in place of the cantilever, except for the embodiments directed to the sticking prevention only at the top end of the movable electrode.

The above measures according to the present invention explained with reference to the embodiments in the form of accelerometers are also applicable to other types of sensors.

Figure 34:
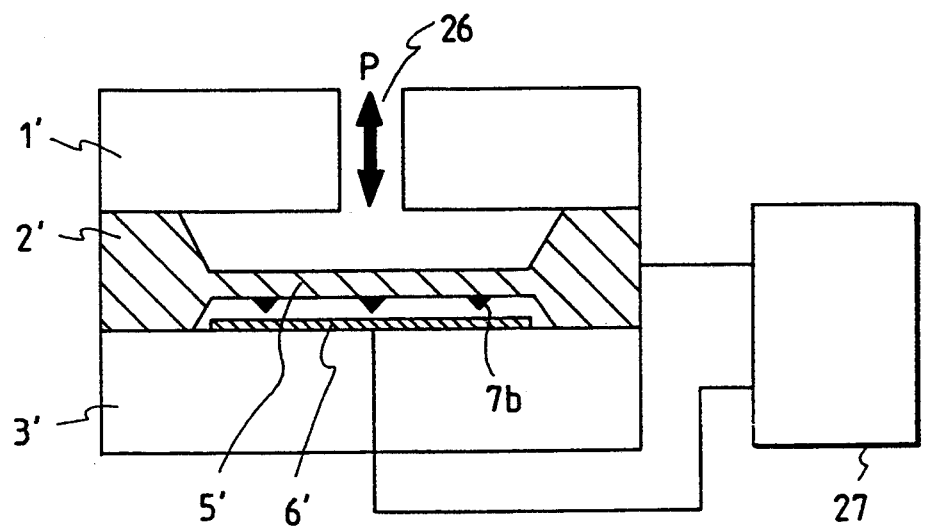
FIG. 34 is a cross sectional view of one embodiment of electrostatic capacitive type micro pressure sensors according to the present invention.

FIG. 34 is a cross sectional view of one embodiment of an electrostatic capacitive type pressure sensor according to the present invention wherein a movable electrode 5' is reconstructed by a diaphragm, and the diaphragm 5' faces a stationary electrode 6' with a microscopic gap and displaces in response to pressure P applied via a communication port 26 and the variation of the electrostatic capacitance between the movable electrode 5' and the stationary electrode 6' caused the applied pressure P is detected by a detection circuit 27 to determine the applied pressure P.

When an excessively large pressure P is applied to the movable electrode diaphragm 5', the movable electrode 5' contacts the stationary electrode 6', however, since a plurality of insulator protrusions 7b having a small top area similar to those in the thirteenth embodiment shown in FIG. 17 are provided on the movable electrode diaphragm 5', the total sticking force between both electrodes when both electrodes contact is reduced and the permanent sticking of the movable electrode diaphragm 5' to the stationary electrode 6 is prevented.

Since a difference in structure between the electrostatic capacitive type pressure sensor and the accelerometers explained above is that the combination of the movable electrode and the cantilevers is constituted by the diaphragm serving as the movable electrode, the measures applied to the accelerometers for preventing the sticking between electrodes are also applicable to the electrostatic capacitive type pressure sensor without substantial modification.

Other than the above accelerometers and the pressure sensor, the present invention is also applicable to such sensors which comprise a movable men,her and a stationary member or another movable men%her facing thereto with a small gap and detects the magnitude of force acting on the movable member to determine the physical amount causing the force, as an electrostatic capacitive type vibration gyro which determines angular velocity based upon Corioli's force acting on the vibrating movable electrode and a visual sensor which determines a distribution of forces acting on a multiplicity of movable electrodes arranged in two dimensions in order to prevent sticking between the movable member and the stationary member.

Hereinabove, the present invention is explained in particular with reference to sensors, the present invention is also applicable to micro actuators which comprise a movable electrode and a stationary electrode or a movable member and a stationary member which are connected to operate in an electrically equivalent manner as the movable and stationary electrodes.

Figure 35A:
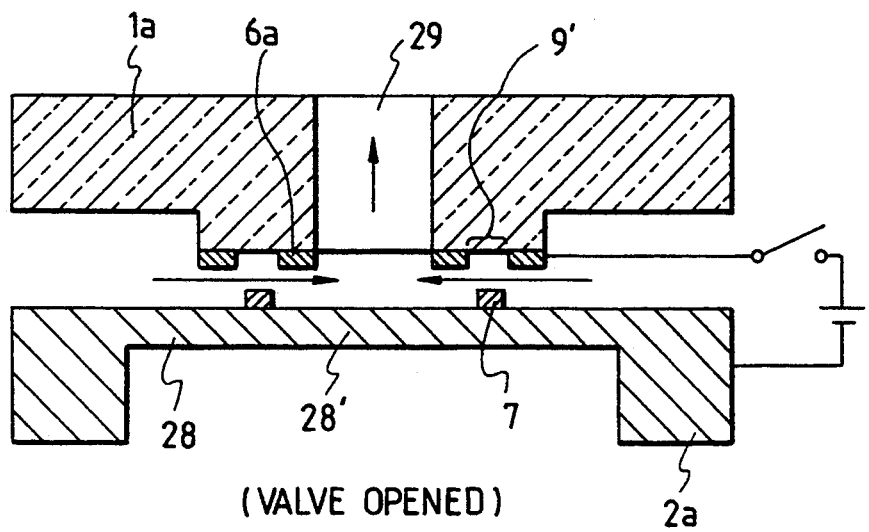
Figure 35B:
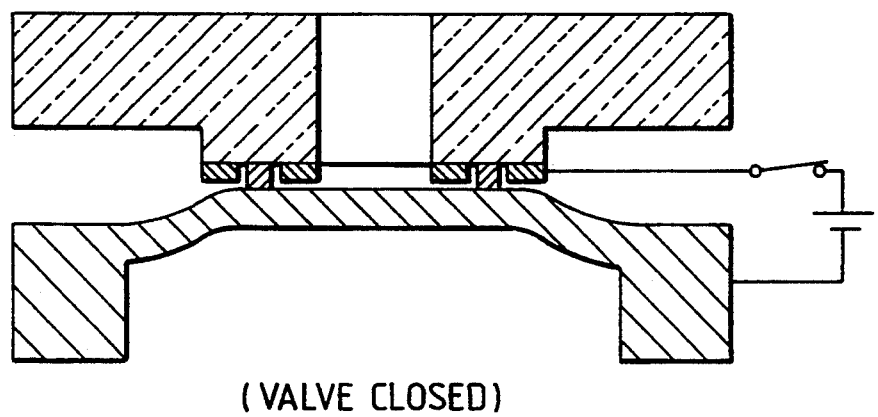

FIG. 35(a) and FIG. 35(b) show a cross sectional view of one embodiment of actuators in the form of an electrostatically open and closable valve according to the present invention. An insulator substrate 1a is provided with a through-hole 29 which constitutes a fluid passage around which a stationary electrode 6a with stationary electrode removing portions 9' like in the embodiments of the accelerometers is provided. The stationary electrode 6a faces a diaphragm 28 formed with a silicon substrate 2a with a small gap. A part of the diaphragm 28 facing the stationary electrode 6a constitutes a movable electrode 28'. At the portions on the movable electrode 28' corresponding to the stationary electrode removing portions 9' the insulator films 7 are disposed which function to prevent bonding by fusion. When no voltage is applied between both electrodes, the diaphragm 28 remains with no displacement as shown in FIG. 35(a) wherein the through-hole 29 is in an open condition and the fluid flows in the arrowed direction or in the anti-arrowed direction depending upon the pressure difference. When a driving voltage is applied between the movable and stationary electrodes, the diaphragm 28 displaces toward the stationary electrode 6a by means of electrostatic attraction force until the insulator films 7 contact the stationary electrode removing portions 9' as illustrated in FIG. 35(b), and under this condition, the valve is closed and no fluid flows therethrough.

With the provision of the stationary electrode removing portions 9', the sticking between the electrodes due to residual dielectric polarization and residual electric charges when an abnormally high voltage is applied between the movable and stationary electrodes, is prevented like in the previous embodiments for the accelerometers. Other measures for preventing the sticking between the electrodes due to residual dielectric polarization and residual electric charges as explained in connection with the previous embodiments for the accelerometers are also applicable to the above actuator to enhance its operational reliability.

The measures for preventing sticking between electrodes as explained with reference to the embodiments for the accelerometers are also applicable for preventing the sticking between the movable portion and the stationary portion for a micro rotary motor, a micro linear motor and a micro switch.

Now, motor vehicle control systems such as anti-lock brake system, traction control system, suspension control system and total spin control system which make use of one of the embodiments for the accelerometers are explained below.

FIG. 36 is a block diaphragm of one embodiment of an anti-lock brake systems (ABS) according to the present invention. In an accelerometer unit 30 of the present invention, the accelerometer of the first embodiment shown in FIG. 1 is incorporated. When the movable electrode 5 tends to displace in response to an acceleration, such is detected as an electrostatic capacity difference $\Delta C = C1 - C2$ between the movable electrode 5 and the stationary electrodes 6 by a $\Delta C$ detector 10a and the detected signal is pulse—width—modulated by a pulse width modulator 10b to apply voltages in inverted relation to each other between the movable electrode 5 and the stationary electrodes 6. Thereby an electrostatic servo control is performed wherein an electrostatic force is applied to the movable electrode 5 so as to always maintain the movable electrode 5 at the center between the stationary electrodes 6. The voltage VE used for the electrostatic servo control is also input to an ABS control unit 31.

The anti-lock brake system is a system in which when the driver presses the brake pedal the braking force is controlled so that the slip rate of the wheels assumes a predetermined value to achieve safety of the motor vehicle. The slip rate S is defined by the following equation.

$$S = (Vr - Vw)/Vr \tag{1}$$

Wherein Vr is a vehicle velocity with respect to the ground in that a true velocity of the vehicle with respect to the road surface, Vw is a velocity determined by the rotating velocity of a vehicle wheel which is equal to the vehicle velocity with respect to the ground when there is no slip (S=0) and is smaller than the vehicle velocity with respect to the ground when there are slips ($0 < S \leq 1$).

The slip rate S is calculated in the ABS control unit 31 and the vehicle velocity with respect to the ground used for the above calculation is calculated according to the following equation by making use of the signal from the accelerometer unit 30.

$$Vr(t) = Vr(0) + \int a(t)dt \tag{2}$$

Namely, the vehicle velocity is calculated by the initial value of the vehicle velocity Vr(0) and time integration of the acceleration $a(t)$. Since the wheel velocity is equal to the vehicle velocity when no slip occurs, the wheel velocity immediately before the brake pedal is pressed, for example, is used as the initial vehicle velocity Vr(0).

When a slip rate S is determined, the ABS control unit drives an actuator for anti-lock use 32 so as to assume the target slip rate S. The actuator for anti-lock use 32 performs a braking force reducing control and accordingly an anti-lock braking control. An example of the actuator for anti-lock use 32 is a solenoid valve for a hydraulic pressure braking force control.

In contrast to the above anti-lock brake system, a control system which provides a driving force to start the vehicle safely and smoothly by controlling the slip rate during starting is a traction control system which also requires a sensor to determine the vehicle velocity with respect to the ground, therefore with the above accelerometer and based upon the above equation (2) the vehicle velocity is obtained in the same manner.

Figure 37:
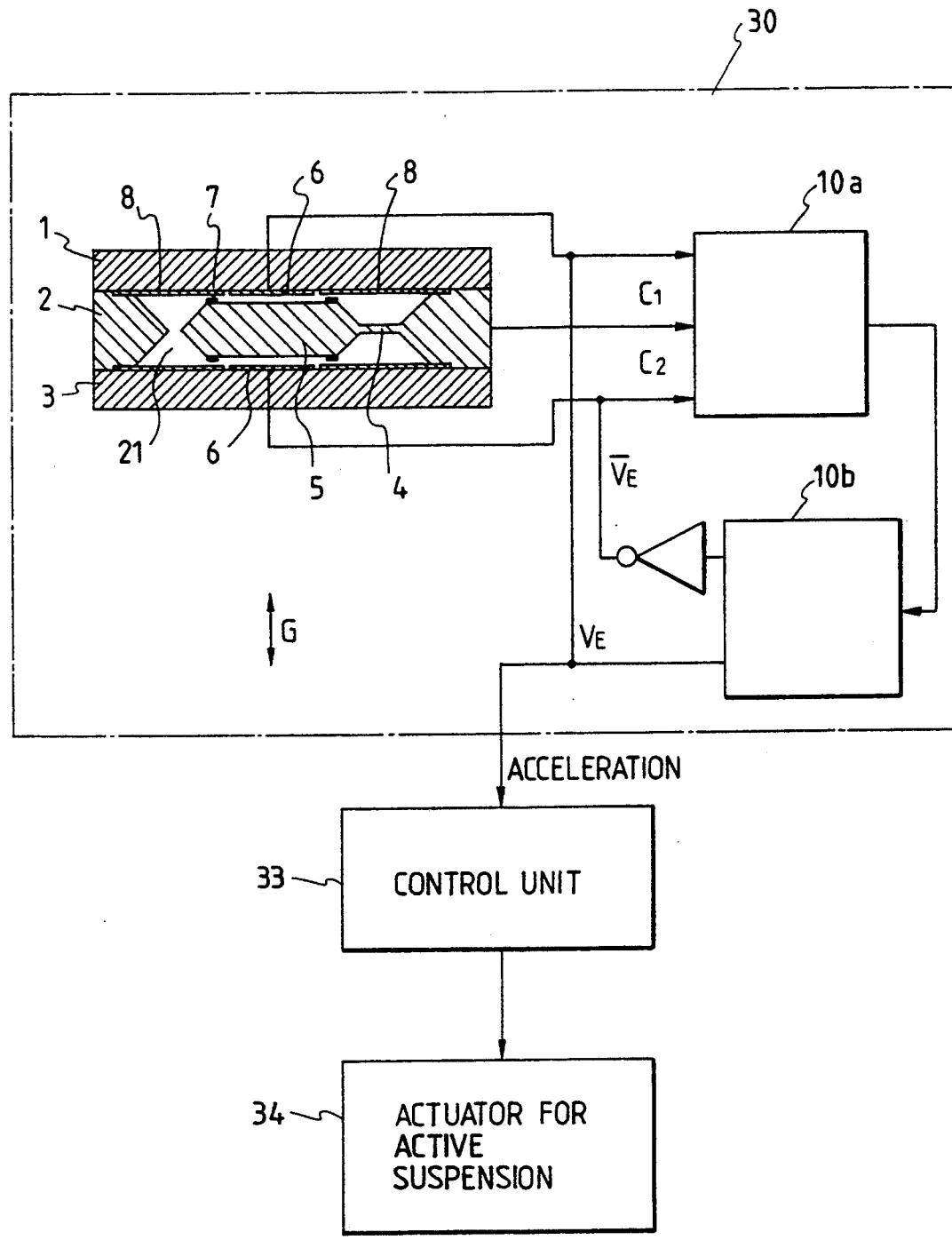
FIG. 37 is a block diagram of another embodiment of vehicle control systems according to the present invention incorporating the micro accelerometer shown in FIG. 1.

FIG. 37 is a block diagram of one embodiment of an active suspension control system according to the present invention.

In the present embodiment, the same accelerometer unit 30 as in the previous embodiment is used. A hydraulic pressure suspension system, which actively controls the up and down vibration and the attitude of the motor vehicle by making use of hydraulic pressure, regulates the forces of hydraulic pressure actuators disposed for the respective four wheels in response to road conditions such as irregularity thereof and the running conditions to suppress the vibration and attitude variation of the vehicle, and to thereby improve the riding comfort as well as driving safety of the vehicle.

With the above accelerometer unit 30, accelerations of the vehicle in front and rear directions and in right and left directions and further in up and down directions are detected, and input to a control unit 33 wherein a control signal is determined based upon the detected accelerations and output to a hydraulic pressure actuator 34 to control the pressure therein.

The suspension is actively controlled through an accurate detection of the vibration and the attitude of the vehicle with the above accelerometer, both the riding comfort and the driving safety of the vehicle together are improved up to a very high level.

Figure 38:
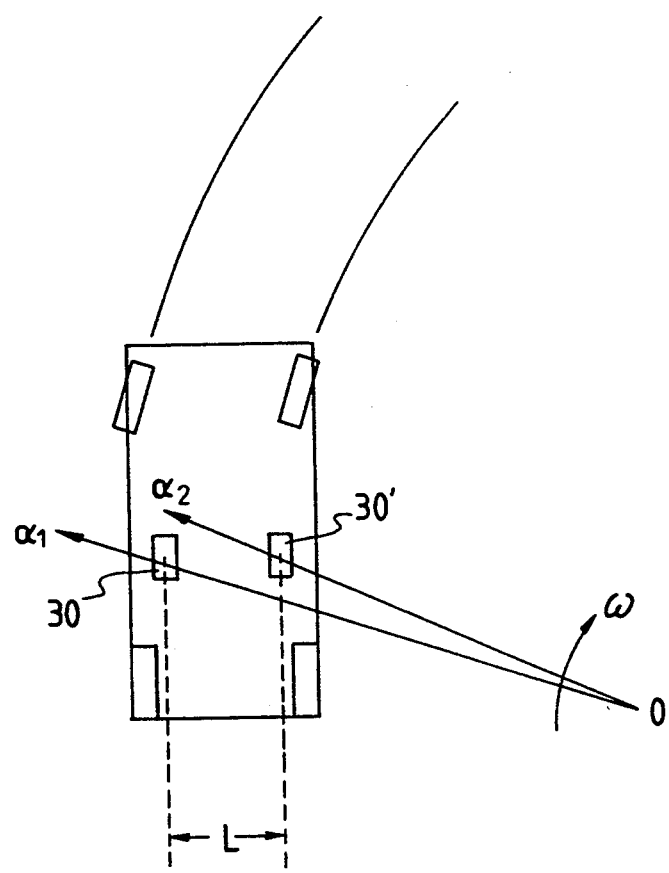
FIG. 38 is a view for explaining measurement of rotating angular velocity of a motor vehicle with a pair of accelerometers.

The total spin control system shown in FIG. 38 is a system which provides a smooth yawing performance as well as a braking performance without unstable swaying for the vehicle and requires a rotating angular velocity sensor for measuring a yaw rate of the vehicle as a major sensor. Now, when two accelerometer units 30 and 30' are mounted on the vehicle with a distance of L, the rotating angular velocity $\omega$ of the vehicle is expressed by the following equation by making use of the detected accelerations $a1$ and $a2$ by the respective accelerometer units 30 and 30'.

$$\omega = \sqrt{|a1 - a2|}/L \tag{3}$$

Other than the above examples, the accelerometer according to the present invention is applicable to a motor vehicle engine total control system, transmission control system and four wheel drive system, and further is used as a collision detection sensor used in an air bag control system relating to motor vehicle safety.

Further the accelerometer according to the present invention is used as an accelerometer or vibration detection sensor for an electric railcar control system, an elevator riding comfort control system and other control systems such as for space application, robot and home appliances.

According to the present invention, the malfunctioning of a micro transducer such as a micro sensor and micro actuator due to sticking between the movable member and the stationary member or between the movable members is prevented and thereby the reliability of the micro sensor, micro actuator and accordingly the systems using the same is greatly improved. Further, the yield during the production of the micro sensor and the micro actuator is improved, thereby the production cost thereof is also reduced.

What is claimed is:

1. An electrostatic type micro transducer comprising,
    a plate shaped movable electrode made of monocrystalline silicon;
    a first substrate of the same material as said plate shaped movable electrode surrounding the plate shaped movable electrode;
    means for connecting said plate shaped movable electrode with said first substrate, said connecting means elastically supporting said plate shaped movable electrode;
    a first stationary electrode facing one major surface of said plate shaped movable electrode with a predetermined gap; and
    first members provided on possible contacting portions of said plate shaped movable electrode;
    means for preventing sticking of said plate shaped movable electrode to said first stationary electrode through said first members due to at least one of residual dielectric polarization, residual electric charges and water located around possible contacting portions between said plate shaped movable electrode and said first stationary electrode, when said plate shaped movable electrode excessively displaces, further comprising,
    a first insulator substrate carrying said first stationary electrode thereon; and wherein said sticking preventing means includes means for reducing electric fields induced around the possible contacting portions to prevent sticking caused by said first members.

2. An electrostatic type micro transducer according to claim 1, wherein said electric field reducing means comprises stationary electrode removed portions formed at the possible contacting portions exposing the surface of said first insulator substrate, and said first members are made of an electrical insulator material.

3. An electrostatic type micro transducer according to claim 2, wherein said electric field reducing means comprises stationary electrode removed portions formed at the possible contacting portions and second members disposed at the stationary electrode removed portions while electrically isolating from said first stationary electrode, and said first members are made of an electrical insulator material.

4. An electrostatic type micro transducer according to claim 2, wherein said electric field reducing means comprises stationary electrode removed portions formed at the possible contacting portions, and equipotentional electrodes with that of said plate shaped movable electrode disposed at the stationary electrode removed portions, and wherein said first members are made of one of an electrical insulator material and an electrically conductive material.

5. An electrostatic type micro transducer according to claim 2, wherein said electric field reducing means comprises said first member made of an electrical insulator material having an increased thickness disposed on dug faces at the possible contacting portions of said plate shaped movable electrode.

6. An electrostatic type micro transducer according to claim 2, wherein said electric field reducing means comprises said first member made of an electrical insulator material having a horizontal extension which first contacts to said stationary electrode when said plate shaped movable electrode excessively displaces.

7. An electrostatic type micro transducer according to claim 2, wherein said electric field reducing means comprises said first member made of a high resistance material.

8. An electrostatic type micro transducer according to claim 2, wherein said electric field reducing means comprises an extension formed integral with said plate shaped movable electrode toward the surrounding first substrate and a groove formed on the surrounding first substrate to limit the movement of the extension.

9. An electrostatic type micro transducer according to claim 2, wherein said electric field reducing means comprises a short circuiting lead connecting an external pad for said plate shaped movable electrode and an external pad for said stationary electrode, said short circuiting lead is provided before mounting the electrostatic type micro transducer and said first members are made of an electrical insulator material.

10. An electrostatic type micro transducer according to claim 2, wherein said first members are made of one of silicon oxide prepared at a dry atmosphere, silicon nitride and silicon oxide formed by steam oxidation which is thereafter heat-treated at about 1000° C.

11. An electrostatic type micro transducer comprising,
a plate shaped movable electrode made of monocrystalline silicon;
a first substrate of the same material as said plate shaped movable electrode surrounding the plate shaped movable electrode;
means for connecting said plate shaped movable electrode with said first substrate, said connecting means elastically supporting said plate shaded movable electrode;
a first stationary electrode facing one major surface of said plate shaped movable electrode with a predetermined gap; and
first members made of an electrical insulator material provided on the possible contacting portions of said plate shaped movable electrode;
means for preventing sticking of said plate shaped movable electrode to said first stationary electrode through said first members due to at least one of residual dielectric polarization, residual electric charges and water located around possible contacting portions between said plate shaped movable electrode and said first stationary electrode, when said plate shaped movable electrode excessively displaces, further comprising,
a first insulator substrate carrying said first stationary electrode; and
wherein said sticking preventing means comprises means for reducing water adsorption and condensation around the possible contacting portions to prevent sticking caused by said first members.

12. An electrostatic type micro transducer according to claim 11, wherein said water reducing means comprises a vaccum environment surrounding the possible contacting portions.

13. An electrostatic type micro transducer according to claim 12, wherein said water reducing means comprises a dry gas environment surrounding the possible contacting portions.

14. An electrostatic type micro transducer according to claim 12, wherein said water reducing means comprises a hydrophobic material applied around the possible contacting portions.

15. An electrostatic type micro transducer according to claim 12, wherein said water reducing means comprises a chemical hydrophobic treatment applied around the possible contacting portions.

16. An electrostatic type micro transducer comprising,
a plate shaped movable electrode made of monocrystalline silicon;
a first substrate of the same material as said plate shaped movable electrode surrounding the plate shaded movable electrode;
means for connecting said plate shaped movable electrode with said first substrate, said connecting means elastically supporting said plate shaped movable electrode;
a first stationary, electrode facing one major surface of said plate shaped movable electrode with a predetermined gap; and
first members made of an electrical insulator material provided on the possible contacting portions of said plate shaped movable electrode;
means for preventing sticking of said plate shaped movable electrode to said first stationary electrode through said first members due to at least one of residual dielectric polarization, residual electric charges and water located around possible contacting portions between said plate shaped movable electrode and said first stationary electrode, when said plate shaped movable electrode excessively displaces, further comprising, a first insulator substrate carrying said first stationary electrode thereon; and wherein said sticking preventing means comprises a combination of means for reducing electric fields induced around the possible contacting portions and means for reducing water adsorption and condensation around the possible contacting portions to prevent sticking caused by said first members.

17. An electrostatic type micro transducer comprising, a plate shaped movable electrode made of monocrystalline silicon;

a first substrate of the same material as said plate shaped movable electrode surrounding the plate shaped movable electrode;

means for connecting said plate shaped movable electrode with said first substrate, said connecting means elastically supporting said plate shaped movable electrode;

a first stationary electrode facing one major surface of said plate shaped movable electrode with a predetermined gap; and means for preventing sticking of said plate shaped movable electrode to said first stationary electrode due to at least one of residual dielectric polarization, residual electric charges and water located around possible contacting portions between said plate shaped movable electrode and said first stationary electrode, when said plate shaped movable electrode excessively displaces, further comprising, a first insulator substrate carrying said first stationary electrode thereon, wherein said sticking preventing means includes means for limiting contacting area between said plate shaped movable electrode and said first stationary electrode in a form of insulator protrusions formed either on one surface of said plate shaped movable electrode or on the surface of said first stationary electrode having one of configurations of pyramid, truncated pyramid, circular cone, truncated circular cone, semi-sphere and laid down triangular prism of which a ridge runs parallel to the axis of said supporting means.

18. An electrostatic type micro transducer according to claim 17, wherein said insulator protrusions are formed uniformly on at least one of the one surface of said plate shaped movable electrode and on the surface of said first stationary electrode.

19. An electrostatic type micro transducer according to claim 17, wherein said insulator protrusions are formed on at least one of the one surface of said plate shaped movable electrode and on the surface of said first stationary electrode at the possible contacting portions.

20. An electrostatic type micro transducer according to claim 19, wherein the top contacting area of the insulator protrusions near said supporting means is determined to be larger than the top contacting areas remote from said supporting means.

21. An electrostatic type micro transducer comprising, a plate shaped movable electrode made of monocrystalline silicon;

a first substrate of the same material as said plate shaped movable electrode surrounding the plate shaped movable electrode;

means for connecting said plate shaped movable electrode with said first substrate, said connecting means elastically supporting said plate shaped movable electrode;

a first stationary electrode facing one major surface of said plate shaped movable electrode with a predetermined gap; and first members made of an electrical insulator material formed on at least one of the one surface of said plate shaped movable electrode and on the surface of said first stationary electrode at the possible contacting portions;

means for preventing sticking of said plate shaped movable electrode to said first stationary electrode through said first members due to at least one of residual dielectric polarization, residual electric charges and water located around possible contacting portions between said plate shaped movable electrode and said first stationary electrode, when said plate shaped movable electrode excessively displaces, further comprising, a first insulator substrate carrying said first stationary electrode thereon;

wherein said sticking preventing means includes means for limiting contacting area between said plate shaped movable electrode and said first stationary electrode in a form of a roughened surface formed on the surfaces opposing said first members.

22. An electrostatic type micro transducer according to claim 21, wherein the surface roughening is performed by one of photolithography, polishing, etching and back sputtering.

23. An electrostatic type micro transducer comprising, a plate shaped movable electrode made of monocrystalline silicon;

a first substrate of the same material as said plate shaped movable electrode surrounding the plate shaped movable electrode;

means for connecting said plate shaped movable electrode with said first substrate, said connecting means elastically supporting said plate shaped movable electrode;

a first stationary electrode facing one major surface of said plate shaped movable electrode with a predetermined gap; and means for preventing sticking of said plate shaped movable electrode to said first stationary electrode due to at least one of residual dielectric polarization, residual electric charges and water located around possible contacting portions between said plate shaded movable electrode and said first stationary electrode, when said plate shaped movable electrode excessively displaces, further comprising, a first insulator substrate carrying said first stationary electrode thereon, wherein said sticking preventing means includes a combination of means for reducing electric fields induced at the possible contacting portions and means for limiting contacting area between said plate shaped movable electrode and said first stationary electrode in a form of insulator protrusions formed on at least one of the one surface of said plate shaped movable electrode and on the surface of said first stationary electrode at possible contacting portions.

24. An electrostatic type micro transducer comprising,
- a plate shaped movable electrode made of monocrystalline silicon;
- a first substrate of the same material as said plate shaped movable electrode surrounding the plate shaped movable electrode;
- means for connecting said plate shaped movable electrode with said first substrate, said connecting means elastically supporting said plate shaped movable electrode;
- a first stationary electrode facing one major surface of said plate shaped movable electrode with a predetermined gap; and
- means for preventing sticking of said plate shaped movable electrode to said first stationary electrode due to at least one of residual dielectric polarization, residual electric charges and water located around possible contacting portions between said plate shaped movable electrode and said first stationary electrode, when said plate shaped movable electrode excessively displaces, further comprising,
- a first insulator substrate carrying said first stationary electrode thereon; and
- first members made of an electrical insulator material formed on at least one of the one surface of said plate shaped movable electrode and on the surface of said first stationary electrode at the possible contacting portions, wherein said sticking preventing means includes a combination of means for reducing electric fields induced at the possible contacting portions of the first members and means for limiting contact area between said plate shaped movable electrode and said first stationary electrode in a form of roughened surfaces formed on the surface opposing said first members.

25. An electrostatic type micro transducer comprising,
- a plate shaped movable electrode made of monocrystalline silicon;
- a first substrate of the same material as said plate shaped movable electrode surrounding the plate shaped movable electrode;
- means for connecting said plate shaped movable electrode with said first substrate, said connecting means elastically supporting said plate shaped movable electrode;
- a first stationary electrode facing one major surface of said plate shaped movable electrode with a predetermined gap; and
- first members provided on the possible contacting portions of said plate shaped movable electrode;
- means for preventing sticking of said plate shaped movable electrode to said first stationary electrode through said first members due to at least one of residual dielectric polarization, residual electric charges and water located around possible contacting portions between said plate shaped movable electrode and said first stationary electrode, when said plate shaped movable electrode excessively displaces, further comprising,
- a second stationary electrode facing the other major surface of said plate shaped movable electrode with a predetermined gap;
- further means for preventing sticking of said plate shaped movable electrode with said second stationary electrode caused by said first members due to at least one of residual dielectric polarization, residual electric charges and water around possible contacting portions between said plate shaped movable electrode and said second stationary electrode when said plate shaped movable electrode excessively displaces;
- a first insulator substrate carrying said first stationary electrode thereon;
- a second insulator substrate carrying said second stationary electrode thereon.

26. An electrostatic type micro transducer comprising,
- a plate shaped movable electrode made of monocrystalline silicon;
- a first substrate of the same material as said plate shaped movable electrode surrounding the plate shaped movable electrode;
- means for connecting said plate shaped movable electrode with said first substrate, said connecting means elastically supporting said plate shaped movable electrode;
- a first stationary electrode facing one major surface of said plate shaped movable electrode with a predetermined gap; and
- means for preventing sticking of said plate shaped movable electrode to said first stationary electrode due to at least one of residual dielectric polarization, residual electric charges and water located around possible contacting portions between said plate shaped movable electrode and said first stationary electrode, when said plate shaped movable electrode excessively displaces;
- a second stationary electrode facing the other major surface of said plate shaped movable electrode with a predetermined gap;
- further means for prevent sticking of said plate shaped movable electrode with said second stationary electrode due to at least one of residual dielectric polarization, residual electric charges and water around possible contacting portions between said plate shaped movable electrode and said second stationary electrode when said plate shaped movable electrode excessively displaces;
- wherein said first and second stationary electrodes are respectively made of monocrystalline silicon and, further comprising a first insulating layer disposed between said first stationary electrode and said first substrate, and a second insulating layer disposed between said first substrate and said second stationary electrode, wherein said both sticking preventing means are means for limiting contacting area between said plate shaped movable electrode and said first and second stationary electrodes in a form of insulator protrusions formed on at least one of the surfaces of said plate shaped movable electrode and on the surfaces of said first and second stationary electrodes at the possible contacting portions having one of the configurations of pyramid, truncated pyramid, circular cone, truncated circular cone, semi-sphere and laid down triangular prism of which a ridge runs parallel to the axis of said supporting means.

27. An electrostatic type micro transducer according to claim 26, wherein one of porous silicon and porous silicon oxide is formed on the surface opposing said insulator protrusions at the possible contacting portions.

28. A motor vehicle control system comprising, an electrostatic type micro accelerometer unit including a plate shaped movable electrode made of monocrystalline silicon; a first substrate of the same material as said plate shaped movable electrode surrounding the plate shaped movable electrode; means for connecting said plate shaped movable electrode with said first substrate, said connecting means elastically supporting said plate shaped movable electrode; a first stationary electrode facing one major surface of said plate shaped movable electrode with a predetermined gap; a stopper means for preventing mechanical contact between said plate shaped movable electrode and said first stationary electrode provided either on said plate shaped movable electrode or on said first stationary electrode at their possible contacting portions when said plate shaped movable electrode excessively displaces toward Said first stationary electrode; and means for preventing permanent sticking of said plate shaped movable electrode to said first stationary electrode through said stopper means due to at least one of residual dielectric polarization, residual electric charges and water located around the possible contacting portions between said plate shaped movable electrode and said first stationary electrode; and at least one of an anti-lock brake control unit; an active suspension control unit; a total spin control unit; a traction control unit; and an air bag control unit, wherein at least one of said anti-lock brake control unit, said active suspension control unit, said total spin control unit, said traction control unit and said air bag control unit performs a predetermined control based upon an output signal from said accelerometer.

29. An electrostatic accelerometer which determines an acceleration by detecting displacement of a pendulum mass comprising:

a first member serving as the pendulum mass;
a second member elastically supporting said first member;
a third member disposed facing said first member via predetermined gap, wherein said first and third members are electrodes;
a fourth member disposed either on said first member or on said third member at a mechanically contactable portion between said first and third members which is designed to prevent said first member from contacting to said third member,
wherein the contactable area at the top end of said fourth member is selected smaller than the bottom area thereof whereby sticking of said first member to said third member via said fourth member is prevented.

30. An accelerometer according to claim 29, wherein said first and second members are made of silicon and said fourth member is made of an insulating material.

31. An accelerometer according to claim 30, wherein said first member also serves as a movable electrode and said third member serves as a stationary electrode.

32. An accelerometer according to claim 29, wherein further comprising a fifth member disposed also facing said first member and, further wherein said first and second members are made of silicon, said first member serves as a movable electrode and is electrically connected to said third member, said fourth member is made of an electrically conductive material and said fifth member serves as a stationary electrode.

33. An electrostatic type micro pressure sensor comprising:

a movable electrode in a form of diaphragm, formed on one of the major surfaces of which a pressure to be detected is designed to be applied;
a stationary electrode disposed facing the other major surface of said movable electrode via a predetermined gap; and
an insulator protrusion disposed either on said movable electrode or on said stationary electrode at a mechanically contactable portion between said movable and stationary electrodes which is designed to prevent said movable electrode from sticking to said stationary electrode, wherein the contactable area at the top end of said insulator protrusion is selected smaller than the bottom area thereof to prevent sticking caused by the insulator protrusion.

34. An electrostatic type micro valve actuator comprising:

a movable electrode in a form of diaphragm serving as a movable valve;
a stationary electrode serving as a stationary valve having an orifice supported on an insulator substrate and disposed facing said movable electrode, a part of said stationary electrode facing said movable electrode is removed at their possible contacting portions when a predetermined voltage is applied between said movable and stationary electrodes exposing the surface of said insulator substrate; and
an insulator protrusion formed either on the exposed surface of said insulator substrate or on the surface of said movable electrode facing the exposed surface of said insulator substrate and having a height which prevents direct contact between said movable and stationary electrodes.

35. An electrostatic type micro transducer comprising:

a movable electrode made of silicon;
a substrate made of silicon for supporting said movable electrode via an elastic connecting means;
a stationary electrode facing one major surface of said movable electrode with a predetermined gap;
a stopper means for preventing mechanical contact between said movable electrode and said stationary electrode provided either on said movable electrode or on said stationary electrode at their possible contacting portions when said movable electrode excessively displaces toward said stationary electrode, said stopper means being configurated in a form of protrusion having a smaller top contactable area than the bottom thereof whereby permanent sticking of said movable electrode to said stationary electrode caused by said stopper means is prevented.

36. An electrostatic type micro transducer according to claim 35, wherein said movable electrode is electrically isolated from said stationary electrode and said stopper means is made of an insulating material.

37. An electrostatic type micro transducer according to claim 35, wherein said movable electrode is electrically connected to said stationary electrode and said stopper means is made of a conductive material.

38. An electrostatic microactuator:
a first member serving as a movable mass;
a second member elastically supporting said first member;

a third member disposed facing said first member via a predetermined gap, wherein said first and third members are electrodes;

a fourth member disposed either on said first member or on said third member at a mechanically contactable portion between said first and third members which is designed to prevent said first member from contacting to said third member, wherein the contactable area at the top end of said fourth member is selected smaller than the bottom area thereof whereby sticking of said first member to said third member via said fourth member is prevented.

* * * * *